(12) United States Patent
Holec et al.

(10) Patent No.: US 12,480,649 B2
(45) Date of Patent: *Nov. 25, 2025

(54) COMPACT HIGH OUTPUT LED LIGHT SOURCE WITH HEAT SINK

(71) Applicant: Metrospec Technology, L.L.C., Mendota Heights, MN (US)

(72) Inventors: Henry V. Holec, Mendota Heights, MN (US); Brian Hillstrom, Rockford, MN (US)

(73) Assignee: Metrospec Technology, L.L.C., Mendota Heights, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 18/670,062

(22) Filed: May 21, 2024

(65) Prior Publication Data

US 2024/0410560 A1  Dec. 12, 2024

Related U.S. Application Data

(63) Continuation of application No. 18/160,726, filed on Jan. 27, 2023, now Pat. No. 12,018,829.

(60) Provisional application No. 63/319,106, filed on Mar. 11, 2022, provisional application No. 63/303,897, filed on Jan. 27, 2022.

(51) Int. Cl.
*F21V 29/74* (2015.01)
*F21Y 115/10* (2016.01)

(52) U.S. Cl.
CPC ........... *F21V 29/74* (2015.01); *F21Y 2115/10* (2016.08)

(58) Field of Classification Search
CPC .................... F21V 29/74; F21Y 2115/10
See application file for complete search history.

(56) References Cited

U.S. PATENT DOCUMENTS

| 5,661,638 A | 8/1997 | Mira |
| 6,992,890 B2 | 1/2006 | Wang et al. |

(Continued)

FOREIGN PATENT DOCUMENTS

| CN | 105258033 | 1/2016 |
| KR | 20150047233 | 5/2015 |

OTHER PUBLICATIONS

"Final Office Action," for U.S. Appl. No. 18/160,726 mailed Oct. 27, 2023 (9 pages).

(Continued)

*Primary Examiner* — Elmito Breval
(74) *Attorney, Agent, or Firm* — Pauly, DeVries Smith & Deffner LLC

(57) ABSTRACT

Embodiments herein relate to high output LED light sources with heat sinks. In an embodiment, a high-output LED light source is included having at least one LED; a circuit board, wherein the at least one LED is mounted on a first side of the circuit board; and a coil shaped heat sink, wherein the coil shaped heat sink is thermally bonded to a second side of the circuit board. In an embodiment, a high-output LED light source is included having at least one LED, a circuit board, wherein the at least one LED is mounted on a first side of the circuit board and a continuous flat wire heat sink. The continuous flat wire heat sink can be soldered to a second side of the circuit board and the continuous flat wire heat sink can be oriented perpendicular to the circuit board. Other embodiments are also included herein.

20 Claims, 16 Drawing Sheets

(56) References Cited

U.S. PATENT DOCUMENTS

| | | |
|---|---|---|
| 7,870,889 B2 | 1/2011 | Zhou et al. |
| 8,525,193 B2 | 9/2013 | Crandell et al. |
| 12,018,829 B2 | 6/2024 | Holec et al. |
| 2007/0131386 A1* | 6/2007 | Tsai .................... H01L 23/3677 257/722 |
| 2010/0290229 A1 | 11/2010 | Meyer et al. |
| 2020/0217495 A1* | 7/2020 | Shum .................... F21V 7/0016 |
| 2023/0250949 A1 | 8/2023 | Holec et al. |

OTHER PUBLICATIONS

"Non-Final Office Action," for U.S. Appl. No. 18/160,726 mailed Jun. 9, 2023 (14 pages).
"Notice of Allowance," for U.S. Appl. No. 18/160,726 mailed Feb. 21, 2024 (9 pages).
"Response to Final Rejection," mailed on Oct. 27, 2023, for U.S. Appl. No. 18/160,726, submitted via EFS-Web on Dec. 27, 2023, 11 pages.
"Response to Non-Final Office Action," for U.S. Appl. No. 18/160,726, filed Aug. 31, 2023 (11 pages).

* cited by examiner

COMPACT HIGH OUTPUT LED LIGHT SOURCE WITH HEAT SINK

This application is a continuation of U.S. application Ser. No. 18/160,726, filed Jan. 27, 2023, which claims the benefit of U.S. Provisional Application No. 63/303,897, filed Jan. 27, 2022, and U.S. Provisional Application No. 63/319,106, filed Mar. 11, 2022, the contents of all of which are herein incorporated by reference in their entirety.

FIELD

Embodiments herein relate to high output LED light sources. More specifically, embodiments herein relate to high output LED light sources with heat sinks.

BACKGROUND

High output LED light sources are commonly used in suspended or inset down light enclosures to project light in a chosen area. The output of such lights is often maximized to reduce architectural spacing or repetition of the light sources while still attaining a specified amount of illumination of a target surface or task area. The height of the light source assembly, including any required optics or lensing is often very important for the fit and appearance of the fixture holding it. Generally, shallow is considered better.

Unfortunately, LED light sources require temperature control to enable efficient operation and to maintain life. High output LED light sources need substantial cooling to stay within operating specifications.

SUMMARY

Embodiments herein relate to high output LED light sources with heat sinks. In a first aspect, a high-output LED light source can be included having at least one LED and a circuit board, wherein the at least one LED can be mounted on a first side of the circuit board, and a coil shaped heat sink and wherein the coil shaped heat sink can be thermally bonded to a second side of the circuit board.

In a second aspect, in addition to one or more of the preceding or following aspects, or in the alternative to some aspects, the coil shaped heat sink can be soldered, brazed, or welded to a second side of the circuit board.

In a third aspect, in addition to one or more of the preceding or following aspects, or in the alternative to some aspects, the circuit board can include one or more metal layers.

In a fourth aspect, in addition to one or more of the preceding or following aspects, or in the alternative to some aspects, the one or more metal layers can be formed of copper.

In a fifth aspect, in addition to one or more of the preceding or following aspects, or in the alternative to some aspects, the circuit board can include a metal clad laminate.

In a sixth aspect, in addition to one or more of the preceding or following aspects, or in the alternative to some aspects, the circuit board can include circular lobes.

In a seventh aspect, in addition to one or more of the preceding or following aspects, or in the alternative to some aspects, the circuit board can include an open center.

In an eighth aspect, in addition to one or more of the preceding or following aspects, or in the alternative to some aspects, further can include a metal layer, wherein the metal layer can be thermally bonded to a side of the circuit board and facilitates heat transfer into the coil shaped heat sink.

In a ninth aspect, in addition to one or more of the preceding or following aspects, or in the alternative to some aspects, the metal layer can include a copper coin.

In a tenth aspect, in addition to one or more of the preceding or following aspects, or in the alternative to some aspects, the coil shaped heat sink can be black in color.

In an eleventh aspect, in addition to one or more of the preceding or following aspects, or in the alternative to some aspects, the coil shaped heat sink can include a coiled metal flat wire.

In a twelfth aspect, in addition to one or more of the preceding or following aspects, or in the alternative to some aspects, the coiled metal flat wire can have a width of 0.1 to 2 inches and a thickness of 0.01 to 0.05 inches.

In a thirteenth aspect, in addition to one or more of the preceding or following aspects, or in the alternative to some aspects, wherein surfaces of the coiled metal flat wire can be substantially flat.

In a fourteenth aspect, in addition to one or more of the preceding or following aspects, or in the alternative to some aspects, wherein surfaces of the coiled metal flat wire include surface features to increase surface area.

In a fifteenth aspect, in addition to one or more of the preceding or following aspects, or in the alternative to some aspects, wherein surfaces of the coiled metal flat wire can be perforated, dimpled, or ribbed.

In a sixteenth aspect, in addition to one or more of the preceding or following aspects, or in the alternative to some aspects, the coil shaped heat sink can be formed of copper.

In a seventeenth aspect, in addition to one or more of the preceding or following aspects, or in the alternative to some aspects, the copper can be 10 mil or thinner.

In an eighteenth aspect, in addition to one or more of the preceding or following aspects, or in the alternative to some aspects, the coil shaped heat sink can include an open center.

In a nineteenth aspect, in addition to one or more of the preceding or following aspects, or in the alternative to some aspects, a portion of the coil shaped heat sink can be not overlapped by the circuit board.

In a twentieth aspect, in addition to one or more of the preceding or following aspects, or in the alternative to some aspects, an outside width of the coil shaped heat sink can be less than an outside width of the circuit board.

In a twenty-first aspect, in addition to one or more of the preceding or following aspects, or in the alternative to some aspects, further can include a plurality of LEDs, wherein the plurality of LEDs can be mounted on the first side of the circuit board.

In a twenty-second aspect, in addition to one or more of the preceding or following aspects, or in the alternative to some aspects, the plurality of LEDs can be COB, SMD, or DIP LEDs.

In a twenty-third aspect, in addition to one or more of the preceding or following aspects, or in the alternative to some aspects, the plurality of LEDs can be arranged in a polygonal pattern.

In a twenty-fourth aspect, in addition to one or more of the preceding or following aspects, or in the alternative to some aspects, further can include three LEDs.

In a twenty-fifth aspect, in addition to one or more of the preceding or following aspects, or in the alternative to some aspects, the three LEDs can be arranged in a triangle pattern.

In a twenty-sixth aspect, in addition to one or more of the preceding or following aspects, or in the alternative to some aspects, the three LEDs can be arranged in an equilateral triangle pattern.

In a twenty-seventh aspect, in addition to one or more of the preceding or following aspects, or in the alternative to some aspects, the circuit board can include one or more vent spaces.

In a twenty-eighth aspect, in addition to one or more of the preceding or following aspects, or in the alternative to some aspects, the one or more vent spaces pass through the circuit board from the first side to the second side.

In a twenty-ninth aspect, in addition to one or more of the preceding or following aspects, or in the alternative to some aspects, the high-output LED light source can be arranged so that the coil shaped heat sink can be disposed on top of the circuit board with respect to the direction of gravity.

In a thirtieth aspect, in addition to one or more of the preceding or following aspects, or in the alternative to some aspects, the high-output LED light source can be arranged so that the coil shaped heat sink can be disposed on an opposite side of the circuit board with respect to the direction of a source of air flow.

In a thirty-first aspect, in addition to one or more of the preceding or following aspects, or in the alternative to some aspects, the at least one LED can be at least 1 W.

In a thirty-second aspect, in addition to one or more of the preceding or following aspects, or in the alternative to some aspects, the at least one LED can be at least 5 W.

In a thirty-third aspect, in addition to one or more of the preceding or following aspects, or in the alternative to some aspects, the at least one LED can be at least 10 W.

In a thirty-fourth aspect, in addition to one or more of the preceding or following aspects, or in the alternative to some aspects, the at least one LED can be at least 15 W.

In a thirty-fifth aspect, in addition to one or more of the preceding or following aspects, or in the alternative to some aspects, a material of the coil shaped heat sink wraps around 360 degrees from 2 to 10 times.

In a thirty-sixth aspect, in addition to one or more of the preceding or following aspects, or in the alternative to some aspects, the coil shaped heat sink can include gaps between adjacent wrapped layers of material.

In a thirty-seventh aspect, in addition to one or more of the preceding or following aspects, or in the alternative to some aspects, the gaps between adjacent wrapped layers of material can be from 0.01 to 0.5 inches.

In a thirty-eighth aspect, in addition to one or more of the preceding or following aspects, or in the alternative to some aspects, the gaps between adjacent wrapped layers of material can be from 0.01 to 0.1 inches.

In a thirty-ninth aspect, in addition to one or more of the preceding or following aspects, or in the alternative to some aspects, the gaps between adjacent wrapped layers of material can be from 0.04 to 0.08 inches.

In a fortieth aspect, in addition to one or more of the preceding or following aspects, or in the alternative to some aspects, the coil shaped heat sink can be a circular coil.

In a forty-first aspect, in addition to one or more of the preceding or following aspects, or in the alternative to some aspects, the coil shaped heat sink can be a non-circular coil.

In a forty-second aspect, in addition to one or more of the preceding or following aspects, or in the alternative to some aspects, the coil shaped heat sink can have a profile height of 0.1 to 2 inches.

In a forty-third aspect, in addition to one or more of the preceding or following aspects, or in the alternative to some aspects, the coil shaped heat sink can have a profile height of 0.5 to 1 inches.

In a forty-fourth aspect, in addition to one or more of the preceding or following aspects, or in the alternative to some aspects, the coil shaped heat sink can have a diameter of 0.5 to 10 inches.

In a forty-fifth aspect, in addition to one or more of the preceding or following aspects, or in the alternative to some aspects, the coil shaped heat sink can have a diameter of 1.5 to 5 inches.

In a forty-sixth aspect, in addition to one or more of the preceding or following aspects, or in the alternative to some aspects, further can include at least one of a lens and a reflector, coupled to the circuit board.

In a forty-seventh aspect, in addition to one or more of the preceding or following aspects, or in the alternative to some aspects, the circuit board can include thermal pads.

In a forty-eighth aspect, in addition to one or more of the preceding or following aspects, or in the alternative to some aspects, the thermal pads can be disposed on an opposite side of and can be aligned with LEDs mounted on the circuit board.

In a forty-ninth aspect, in addition to one or more of the preceding or following aspects, or in the alternative to some aspects, further can include a second circuit board, wherein the second circuit board can be thermally bonded to the coil shaped heat sink on an opposite side from the circuit board and LEDS can be mounted on the second circuit board on a side opposite the coil shaped heat sink.

In a fiftieth aspect, in addition to one or more of the preceding or following aspects, or in the alternative to some aspects, the high-output LED light source can be effective to dissipate at least 10 watts of heat from each LED in steady state.

In a fifty-first aspect, in addition to one or more of the preceding or following aspects, or in the alternative to some aspects, the coil shaped heat sink can be effective to dissipate at least 30 watts of heat in the aggregate in steady state.

In a fifty-second aspect, in addition to one or more of the preceding or following aspects, or in the alternative to some aspects, the circuit board can include one or more attachment lobes.

In a fifty-third aspect, a high-output LED light source can be included having at least one LED, a circuit board, wherein the at least one LED can be mounted on a first side of the circuit board, and a continuous flat wire heat sink, wherein the continuous flat wire heat sink can be soldered to a second side of the circuit board, and wherein the continuous flat wire heat sink can be oriented perpendicular to the circuit board.

In a fifty-fourth aspect, in addition to one or more of the preceding or following aspects, or in the alternative to some aspects, the continuous flat wire heat sink can be soldered, brazed, or welded to a second side of the circuit board.

In a fifty-fifth aspect, in addition to one or more of the preceding or following aspects, or in the alternative to some aspects, the circuit board can include one or more metal layers.

In a fifty-sixth aspect, in addition to one or more of the preceding or following aspects, or in the alternative to some aspects, the one or more metal layers can be formed of copper.

In a fifty-seventh aspect, in addition to one or more of the preceding or following aspects, or in the alternative to some aspects, the circuit board can include a metal clad laminate.

In a fifty-eighth aspect, in addition to one or more of the preceding or following aspects, or in the alternative to some aspects, the circuit board can include circular lobes.

In a fifty-ninth aspect, in addition to one or more of the preceding or following aspects, or in the alternative to some aspects, the circuit board can include an open center.

In a sixtieth aspect, in addition to one or more of the preceding or following aspects, or in the alternative to some aspects, the continuous flat wire heat sink can include a metal flat wire.

In a sixty-first aspect, in addition to one or more of the preceding or following aspects, or in the alternative to some aspects, the metal flat wire can have a width of 0.1 to 2 inches and a thickness of 0.01 to 0.05 inches.

In a sixty-second aspect, in addition to one or more of the preceding or following aspects, or in the alternative to some aspects, wherein surfaces of the metal flat wire can be substantially flat.

In a sixty-third aspect, in addition to one or more of the preceding or following aspects, or in the alternative to some aspects, wherein surfaces of the metal flat wire include surface features to increase surface area.

In a sixty-fourth aspect, in addition to one or more of the preceding or following aspects, or in the alternative to some aspects, wherein surfaces of the metal flat wire can be perforated, dimpled, or ribbed.

In a sixty-fifth aspect, in addition to one or more of the preceding or following aspects, or in the alternative to some aspects, the continuous flat wire heat sink can be formed of copper.

In a sixty-sixth aspect, in addition to one or more of the preceding or following aspects, or in the alternative to some aspects, further can include an open center.

In a sixty-seventh aspect, in addition to one or more of the preceding or following aspects, or in the alternative to some aspects, a portion of the continuous flat wire heat sink can be not overlapped by the circuit board.

In a sixty-eighth aspect, in addition to one or more of the preceding or following aspects, or in the alternative to some aspects, an outside width of the continuous flat wire heat sink can be less than an outside width of the circuit board.

In a sixty-ninth aspect, in addition to one or more of the preceding or following aspects, or in the alternative to some aspects, further can include a plurality of LEDs, wherein the plurality of LEDs can be mounted on the first side of the circuit board.

In a seventieth aspect, in addition to one or more of the preceding or following aspects, or in the alternative to some aspects, the plurality of LEDs can be COB, SMD, or DIP LEDs.

In a seventy-first aspect, in addition to one or more of the preceding or following aspects, or in the alternative to some aspects, the plurality of LEDs can be arranged in a polygonal pattern.

In a seventy-second aspect, in addition to one or more of the preceding or following aspects, or in the alternative to some aspects, further can include three LEDs.

In a seventy-third aspect, in addition to one or more of the preceding or following aspects, or in the alternative to some aspects, the three LEDs can be arranged in a triangle pattern.

In a seventy-fourth aspect, in addition to one or more of the preceding or following aspects, or in the alternative to some aspects, the three LEDs can be arranged in an equilateral triangle pattern.

In a seventy-fifth aspect, in addition to one or more of the preceding or following aspects, or in the alternative to some aspects, the circuit board can include one or more vent spaces.

In a seventy-sixth aspect, in addition to one or more of the preceding or following aspects, or in the alternative to some aspects, the one or more vent spaces pass through the circuit board from the first side to the second side.

In a seventy-seventh aspect, in addition to one or more of the preceding or following aspects, or in the alternative to some aspects, the high-output LED light source can be arranged so that the continuous flat wire heat sink can be disposed on top of the circuit board with respect to the direction of gravity.

In a seventy-eighth aspect, in addition to one or more of the preceding or following aspects, or in the alternative to some aspects, the high-output LED light source can be arranged so that the continuous flat wire heat sink can be disposed on an opposite side of the circuit board with respect to the direction of a source of air flow.

In a seventy-ninth aspect, in addition to one or more of the preceding or following aspects, or in the alternative to some aspects, the at least one LED can be at least 1 W.

In an eightieth aspect, in addition to one or more of the preceding or following aspects, or in the alternative to some aspects, the at least one LED can be at least 5 W.

In an eighty-first aspect, in addition to one or more of the preceding or following aspects, or in the alternative to some aspects, the at least one LED can be at least 10 W.

In an eighty-second aspect, in addition to one or more of the preceding or following aspects, or in the alternative to some aspects, the at least one LED can be at least 15 W.

In an eighty-third aspect, in addition to one or more of the preceding or following aspects, or in the alternative to some aspects, the continuous flat wire heat sink can have a profile height of 0.1 to 2 inches.

In an eighty-fourth aspect, in addition to one or more of the preceding or following aspects, or in the alternative to some aspects, the continuous flat wire heat sink can have a profile height of 0.5 to 1 inches.

In an eighty-fifth aspect, in addition to one or more of the preceding or following aspects, or in the alternative to some aspects, the continuous flat wire heat sink can have a diameter of 0.5 to 10 inches.

In an eighty-sixth aspect, in addition to one or more of the preceding or following aspects, or in the alternative to some aspects, the continuous flat wire heat sink can have a diameter of 1.5 to 5 inches.

In an eighty-seventh aspect, in addition to one or more of the preceding or following aspects, or in the alternative to some aspects, further can include at least one of a lens and a reflector, coupled to the circuit board.

In an eighty-eighth aspect, in addition to one or more of the preceding or following aspects, or in the alternative to some aspects, the circuit board can include thermal pads.

In an eighty-ninth aspect, in addition to one or more of the preceding or following aspects, or in the alternative to some aspects, the thermal pads can be disposed on an opposite side of and can be aligned with LEDs mounted on the circuit board.

In a ninetieth aspect, in addition to one or more of the preceding or following aspects, or in the alternative to some aspects, further can include a second circuit board, wherein the second circuit board can be thermally bonded to the continuous flat wire heat sink on an opposite side from the circuit board and LEDS can be mounted on the second circuit board on a side opposite the continuous flat wire heat sink.

In a ninety-first aspect, in addition to one or more of the preceding or following aspects, or in the alternative to some aspects, the high-output LED light source can be effective to dissipate at least 10 watts of heat from each LED in steady state.

In a ninety-second aspect, in addition to one or more of the preceding or following aspects, or in the alternative to some aspects, the continuous flat wire heat sink can be effective to dissipate at least 30 watts of heat in the aggregate in steady state.

In a ninety-third aspect, a high-output LED light source can be included having at least one LED, a circuit board, wherein the at least one LED can be mounted on a first side of the circuit board, and a flat wire heat sink, wherein the flat wire heat sink can be soldered to a second side of the circuit board, wherein the flat wire heat sink can be oriented perpendicular to the circuit board, and wherein a portion of the flat wire heat sink can be not overlapped by the circuit board.

In a ninety-fourth aspect, in addition to one or more of the preceding or following aspects, or in the alternative to some aspects, the flat wire heat sink can be soldered, brazed, or welded to a second side of the circuit board.

In a ninety-fifth aspect, in addition to one or more of the preceding or following aspects, or in the alternative to some aspects, the circuit board can include one or more metal layers.

In a ninety-sixth aspect, in addition to one or more of the preceding or following aspects, or in the alternative to some aspects, the one or more metal layers can be formed of copper.

In a ninety-seventh aspect, in addition to one or more of the preceding or following aspects, or in the alternative to some aspects, the circuit board can include a metal clad laminate.

In a ninety-eighth aspect, in addition to one or more of the preceding or following aspects, or in the alternative to some aspects, the circuit board can include circular lobes.

In a ninety-ninth aspect, in addition to one or more of the preceding or following aspects, or in the alternative to some aspects, the circuit board can include an open center.

In a one hundred and aspect, in addition to one or more of the preceding or following aspects, or in the alternative to some aspects, the flat wire heat sink can include a metal flat wire.

In a one hundred and first aspect, in addition to one or more of the preceding or following aspects, or in the alternative to some aspects, the metal flat wire can have a width of 0.1 to 2 inches and a thickness of 0.01 to 0.05 inches.

In a one hundred and second aspect, in addition to one or more of the preceding or following aspects, or in the alternative to some aspects, wherein surfaces of the metal flat wire can be substantially flat.

In a one hundred and third aspect, in addition to one or more of the preceding or following aspects, or in the alternative to some aspects, wherein surfaces of the metal flat wire include surface features to increase surface area.

In a one hundred and fourth aspect, in addition to one or more of the preceding or following aspects, or in the alternative to some aspects, wherein surfaces of the metal flat wire can be perforated, dimpled, or ribbed.

In a one hundred and fifth aspect, in addition to one or more of the preceding or following aspects, or in the alternative to some aspects, the flat wire heat sink can be formed of copper.

In a one hundred and sixth aspect, in addition to one or more of the preceding or following aspects, or in the alternative to some aspects, further can include an open center.

In a one hundred and seventh aspect, in addition to one or more of the preceding or following aspects, or in the alternative to some aspects, a portion of the flat wire heat sink can be not overlapped by the circuit board.

In a one hundred and eighth aspect, in addition to one or more of the preceding or following aspects, or in the alternative to some aspects, an outside width of the flat wire heat sink can be less than an outside width of the circuit board.

In a one hundred and ninth aspect, in addition to one or more of the preceding or following aspects, or in the alternative to some aspects, further can include a plurality of LEDs, wherein the plurality of LEDs can be mounted on the first side of the circuit board.

In a one hundred and tenth aspect, in addition to one or more of the preceding or following aspects, or in the alternative to some aspects, the plurality of LEDs can be COB, SMD, or DIP LEDs.

In a one hundred and eleventh aspect, in addition to one or more of the preceding or following aspects, or in the alternative to some aspects, the plurality of LEDs can be arranged in a polygonal pattern.

In a one hundred and twelfth aspect, in addition to one or more of the preceding or following aspects, or in the alternative to some aspects, further can include three LEDs.

In a one hundred and thirteenth aspect, in addition to one or more of the preceding or following aspects, or in the alternative to some aspects, the three LEDs can be arranged in a triangle pattern.

In a one hundred and fourteenth aspect, in addition to one or more of the preceding or following aspects, or in the alternative to some aspects, the three LEDs can be arranged in an equilateral triangle pattern.

In a one hundred and fifteenth aspect, in addition to one or more of the preceding or following aspects, or in the alternative to some aspects, the circuit board can include one or more vent spaces.

In a one hundred and sixteenth aspect, in addition to one or more of the preceding or following aspects, or in the alternative to some aspects, the one or more vent spaces pass through the circuit board from the first side to the second side.

In a one hundred and seventeenth aspect, in addition to one or more of the preceding or following aspects, or in the alternative to some aspects, the high-output LED light source can be arranged so that the flat wire heat sink can be disposed on top of the circuit board with respect to the direction of gravity.

In a one hundred and eighteenth aspect, in addition to one or more of the preceding or following aspects, or in the alternative to some aspects, the high-output LED light source can be arranged so that the flat wire heat sink can be disposed on an opposite side of the circuit board with respect to the direction of a source of air flow.

In a one hundred and nineteenth aspect, in addition to one or more of the preceding or following aspects, or in the alternative to some aspects, the at least one LED can be at least 1 W.

In a one hundred and twentieth aspect, in addition to one or more of the preceding or following aspects, or in the alternative to some aspects, the at least one LED can be at least 5 W.

In a one hundred and twenty-first aspect, in addition to one or more of the preceding or following aspects, or in the alternative to some aspects, the at least one LED can be at least 10 W.

In a one hundred and twenty-second aspect, in addition to one or more of the preceding or following aspects, or in the alternative to some aspects, the at least one LED can be at least 15 W.

In a one hundred and twenty-third aspect, in addition to one or more of the preceding or following aspects, or in the alternative to some aspects, the flat wire heat sink can have a profile height of 0.1 to 2 inches.

In a one hundred and twenty-fourth aspect, in addition to one or more of the preceding or following aspects, or in the alternative to some aspects, the flat wire heat sink can have a profile height of 0.5 to 1 inches.

In a one hundred and twenty-fifth aspect, in addition to one or more of the preceding or following aspects, or in the alternative to some aspects, the flat wire heat sink can have a diameter of 0.5 to 10 inches.

In a one hundred and twenty-sixth aspect, in addition to one or more of the preceding or following aspects, or in the alternative to some aspects, the flat wire heat sink can have a diameter of 1.5 to 5 inches.

In a one hundred and twenty-seventh aspect, in addition to one or more of the preceding or following aspects, or in the alternative to some aspects, further can include at least one of a lens and a reflector, coupled to the circuit board.

In a one hundred and twenty-eighth aspect, in addition to one or more of the preceding or following aspects, or in the alternative to some aspects, the circuit board can include thermal pads.

In a one hundred and twenty-ninth aspect, in addition to one or more of the preceding or following aspects, or in the alternative to some aspects, the thermal pads can be disposed on an opposite side of and can be aligned with LEDs mounted on the circuit board.

In a one hundred and thirtieth aspect, in addition to one or more of the preceding or following aspects, or in the alternative to some aspects, further can include a second circuit board, wherein the second circuit board can be thermally bonded to the flat wire heat sink on an opposite side from the circuit board and LEDS can be mounted on the second circuit board on a side opposite the flat wire heat sink.

In a one hundred and thirty-first aspect, in addition to one or more of the preceding or following aspects, or in the alternative to some aspects, the high-output LED light source can be effective to dissipate at least 10 watts of heat from each LED in steady state.

In a one hundred and thirty-second aspect, in addition to one or more of the preceding or following aspects, or in the alternative to some aspects, the flat wire heat sink can be effective to dissipate at least 30 watts of heat in the aggregate in steady state.

In a one hundred and thirty-third aspect, a method of making heat sinks on a spindle can be included, the method including unwinding a flat wire from a supply spool, winding the flat wire around the spindle with spacing between adjacent wraps of the flat wire to form a stacked coil, and heating the stacked coil to release stress therein.

In a one hundred and thirty-fourth aspect, in addition to one or more of the preceding or following aspects, or in the alternative to some aspects, the method can further include gripping a terminal end of the stacked coil and vibrating it.

In a one hundred and thirty-fifth aspect, in addition to one or more of the preceding or following aspects, or in the alternative to some aspects, the method can further include winding multiple flat wires around the spindle simultaneously to form multiple stacked coils.

In a one hundred and thirty-sixth aspect, in addition to one or more of the preceding or following aspects, or in the alternative to some aspects, the multiple stacked coils have identical spacing between adjacent wraps of the flat wire.

In a one hundred and thirty-seventh aspect, in addition to one or more of the preceding or following aspects, or in the alternative to some aspects, the spindle can include a slotted spindle.

In a one hundred and thirty-eighth aspect, in addition to one or more of the preceding or following aspects, or in the alternative to some aspects, wherein winding the flat wire includes winding a plurality of flat wires simultaneously.

In a one hundred and thirty-ninth aspect, in addition to one or more of the preceding or following aspects, or in the alternative to some aspects, wherein winding the flat wire includes winding a plurality of flat wires simultaneously side by side.

In a one hundred and fortieth aspect, in addition to one or more of the preceding or following aspects, or in the alternative to some aspects, wherein winding the flat wire includes winding at least 10 flat wires simultaneously side by side.

In a one hundred and forty-first aspect, a method of making a high-output LED light source can be included, the method including applying a solder paste to a circuit board, placing one or more LED emitters onto a first side of the circuit board, placing a heat sink onto a second side of the circuit board, and reflowing the solder paste to bond the one or more LED emitters and the heat sink to the circuit board.

In a one hundred and forty-second aspect, in addition to one or more of the preceding or following aspects, or in the alternative to some aspects, the circuit board can be part of a panel of circuit boards.

In a one hundred and forty-third aspect, in addition to one or more of the preceding or following aspects, or in the alternative to some aspects, the method can further include separating the circuit board with the bonded one or more LED emitters and the heat sink from the panel.

In a one hundred and forty-fourth aspect, in addition to one or more of the preceding or following aspects, or in the alternative to some aspects, the method can further include attaching one or more lenses to the high-output LED light source.

In a one hundred and forty-fifth aspect, a lighting fixture can be included having a housing, and a high-output LED light source, wherein the high-output LED light source can be supported by the housing, the high-output LED light source can include at least one LED, a circuit board, wherein the at least one LED can be mounted on a first side of the circuit board, and a coil shaped heat sink, wherein the coil shaped heat sink can be thermally bonded to a second side of the circuit board.

In a one hundred and forty-sixth aspect, in addition to one or more of the preceding or following aspects, or in the alternative to some aspects, the housing can include: a cylinder, wherein the high-output LED light source can be disposed within the cylinder, and a lighting fixture further can include a heat source, wherein the heat source can be disposed above the high-output LED light source.

In a one hundred and forty-seventh aspect, a high-output LED light source can be included having at least one LED, a circuit board, and a serpentine shaped heat sink, the serpentine shaped heat sink can include a plurality of switchbacks, and wherein the serpentine shaped heat sink can be thermally bonded to a second side of the circuit board.

In a one hundred and forty-eighth aspect, in addition to one or more of the preceding or following aspects, or in the alternative to some aspects, the serpentine shaped heat sink can be soldered, brazed, or welded to the second side of the circuit board.

In a one hundred and forty-ninth aspect, in addition to one or more of the preceding or following aspects, or in the alternative to some aspects, a portion of the serpentine shaped heat sink can be not overlapped by the circuit board.

In a one hundred and fiftieth aspect, in addition to one or more of the preceding or following aspects, or in the alternative to some aspects, an outside width of the serpentine shaped heat sink can be greater than an outside width of the circuit board.

In a one hundred and fifty-first aspect, in addition to one or more of the preceding or following aspects, or in the alternative to some aspects, further can include a plurality of LEDs.

In a one hundred and fifty-second aspect, in addition to one or more of the preceding or following aspects, or in the alternative to some aspects, the plurality of LEDs can be COB, SMD, or DIP LEDs.

In a one hundred and fifty-third aspect, in addition to one or more of the preceding or following aspects, or in the alternative to some aspects, the plurality of LEDs can be arranged in a line.

In a one hundred and fifty-fourth aspect, in addition to one or more of the preceding or following aspects, or in the alternative to some aspects, the plurality of LEDs can be arranged in a polygonal pattern.

In a one hundred and fifty-fifth aspect, in addition to one or more of the preceding or following aspects, or in the alternative to some aspects, the serpentine shaped heat sink further can include channels between adjacent switchbacks of material.

In a one hundred and fifty-sixth aspect, in addition to one or more of the preceding or following aspects, or in the alternative to some aspects, further can include at least one of a lens and a reflector, coupled to the circuit board.

In a one hundred and fifty-seventh aspect, in addition to one or more of the preceding or following aspects, or in the alternative to some aspects, the circuit board can include thermal pads.

In a one hundred and fifty-eighth aspect, in addition to one or more of the preceding or following aspects, or in the alternative to some aspects, the thermal pads can be disposed on an opposite side of and can be aligned with LEDs mounted on the circuit board.

In a one hundred and fifty-ninth aspect, in addition to one or more of the preceding or following aspects, or in the alternative to some aspects, the high-output LED light source can be effective to dissipate at least 10 watts of heat from each LED in steady state.

In a one hundred and sixtieth aspect, in addition to one or more of the preceding or following aspects, or in the alternative to some aspects, the serpentine shaped heat sink can be effective to dissipate at least 30 watts of heat in the aggregate in steady state.

In a one hundred and sixty-first aspect, in addition to one or more of the preceding or following aspects, or in the alternative to some aspects, the circuit board can be rectangular.

In a one hundred and sixty-second aspect, in addition to one or more of the preceding or following aspects, or in the alternative to some aspects, a longitudinal axis of the circuit board can be parallel with a longitudinal axis of the serpentine shaped heat sink.

In a one hundred and sixty-third aspect, a high-output LED light source can be included having at least one LED, and a circuit board, the circuit board can include an outer ring, and a plurality of extensions, wherein the plurality of extensions each projects from the outer ring towards a center of the circuit board, and a coil shaped heat sink, wherein the coil shaped heat sink can be thermally bonded to a second side of the circuit board.

In a one hundred and sixty-fourth aspect, in addition to one or more of the preceding or following aspects, or in the alternative to some aspects, the coil shaped heat sink can be soldered, brazed, or welded to the second side of the circuit board.

In a one hundred and sixty-fifth aspect, in addition to one or more of the preceding or following aspects, or in the alternative to some aspects, an outside width of the coil shaped heat sink can be less than an outside width of the circuit board.

In a one hundred and sixty-sixth aspect, in addition to one or more of the preceding or following aspects, or in the alternative to some aspects, further can include a plurality of LEDs, wherein each of the plurality of LEDs can be disposed on an extension.

In a one hundred and sixty-seventh aspect, in addition to one or more of the preceding or following aspects, or in the alternative to some aspects, the plurality of LEDs can be COB, SMD, or DIP LEDs.

In a one hundred and sixty-eighth aspect, in addition to one or more of the preceding or following aspects, or in the alternative to some aspects, the plurality of LEDs can be arranged in a circular pattern.

In a one hundred and sixty-ninth aspect, in addition to one or more of the preceding or following aspects, or in the alternative to some aspects, further can include at least one of a lens and a reflector, coupled to the circuit board.

In a one hundred and seventieth aspect, in addition to one or more of the preceding or following aspects, or in the alternative to some aspects, the circuit board further can include thermal pads.

In a one hundred and seventy-first aspect, in addition to one or more of the preceding or following aspects, or in the alternative to some aspects, the thermal pads can be disposed on an opposite side of and can be aligned with LEDs mounted on the circuit board.

In a one hundred and seventy-second aspect, in addition to one or more of the preceding or following aspects, or in the alternative to some aspects, the high-output LED light source can be effective to dissipate at least 10 watts of heat from each LED in steady state.

In a one hundred and seventy-third aspect, in addition to one or more of the preceding or following aspects, or in the alternative to some aspects, the coil shaped heat sink can be effective to dissipate at least 30 watts of heat in the aggregate in steady state.

In a one hundred and seventy-fourth aspect, in addition to one or more of the preceding or following aspects, or in the alternative to some aspects, wherein at least one LED can be disposed on each of the extensions.

In a one hundred and seventy-fifth aspect, in addition to one or more of the preceding or following aspects, or in the alternative to some aspects, the circuit board further can include at least one vent.

In a one hundred and seventy-sixth aspect, in addition to one or more of the preceding or following aspects, or in the alternative to some aspects, the plurality of extensions can be equally distributed around a center axis of the outer ring.

In a one hundred and seventy-seventh aspect, in addition to one or more of the preceding or following aspects, or in the alternative to some aspects, the circuit board further can include a center opening.

In a one hundred and seventy-eighth aspect, in addition to one or more of the preceding or following aspects, or in the alternative to some aspects, the outer ring can be circular.

In a one hundred and seventy-ninth aspect, in addition to one or more of the preceding or following aspects, or in the alternative to some aspects, the circuit board further can include a plurality of vents.

In a one hundred and eightieth aspect, in addition to one or more of the preceding or following aspects, or in the alternative to some aspects, the plurality of vents can be equally distributed around a center axis of the outer ring.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope herein is defined by the appended claims and their legal equivalents.

BRIEF DESCRIPTION OF THE FIGURES

The technology may be more completely understood in connection with the following drawings, in which.

While the technology is susceptible to various modifications and alternative forms, specifics thereof have been shown by way of example and drawings, and will be described in detail. It should be understood, however, that the application is not limited to the particular embodiments described. On the contrary, the application is to cover modifications, equivalents, and alternatives falling within the spirit and scope of the technology.

DETAILED DESCRIPTION

As described above, LED light sources require temperature control to enable efficient operation and to maintain life. In particular, high output LED light sources need substantial cooling to stay within operating specifications. However, it remains challenging to design and manufacture heat sinks that are relatively low profile and effective to provide cooling for high output LED light sources.

Embodiments herein include low profile, high output single or multi-LED light sources capable of up to 10 watts or more thermal dissipation per LED. The light sources can utilize thermally conductive layered circuit boards and a flat wire heat sink soldered on the side opposite from the LEDs. In some embodiments, lenses may be added to the LED side of the circuit board to make a more functional assembly that can project light in a variety of distributions while enabling low resistance to air flow that passes through the light source for cooling. The assembly can be mounted by a number of methods inside an enclosing structure or housing.

Embodiments of light source assemblies herein can attain various characteristics that can differentiate the performance. First, various embodiments herein use gravity air flow alone. As an example, some embodiments using gravity air flow alone are able to dissipate at least 20 watts using a heat sink only 0.750 inches deep by 2.5 inches in width. Second, various embodiments use and incorporate a physical heat sink. Various embodiments with a heat sink can demonstrate low air resistance to air flowing through the heat sink. In some embodiments, the air flow can be further assisted by a fan or another forced air device. Third, various embodiments herein can define a hole or aperture in the middle of the light source assembly that can be used for mounting or a complete pass through of a suspending member, wire set, additional optical element, or any of a number of purposes. Fourth, various embodiments herein are able to efficiently project over 2500 lumens of light from a package measuring less than 2.75 inches in diameter by 0.85 inches in height. Fifth, various embodiments herein can control the light to a beam as small as 15 degrees diameter at a distance or less.

Various embodiments of a novel light source are described below. Various embodiments include different circuit board geometries, emitter positions, coil materials, coil geometries, attachment methods, lens types, and emitters can be used to attain similar functional elements discussed below.

Figure 1:
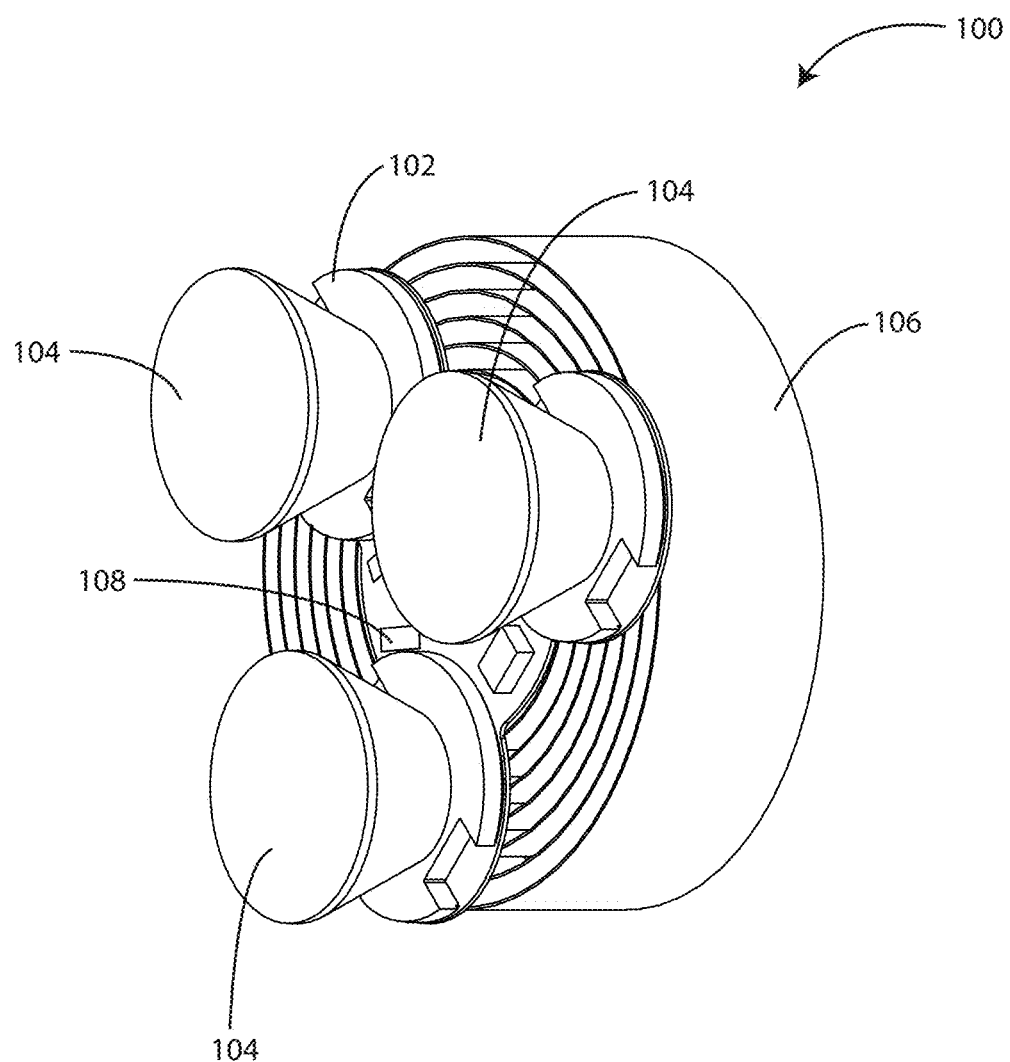
FIG. 1 is a perspective view of a light source in accordance with various embodiments herein.

FIG. 1 shows a perspective view of a light source 100 in accordance with various embodiments herein. The light source 100 can include a circuit board 102. The circuit board 102 can include at least one emitter. In various embodiments, an emitter can be a a light emitting diode ("LED"). The light source 100 can include a lens 104 over each emitter. In the embodiment shown in FIG. 1, the light source 100 includes three LEDs and three lenses 104.

In various embodiments, the light source 100 can include a heat sink 106. In some embodiments, the heat sink 106 can be a coiled heat sink. In various embodiments, the LEDs and the lenses 104 can be disposed on a first side of the circuit board 102, and the heat sink 106 can be disposed on a second side of the circuit board 102 opposite from the first side of the circuit board 102. The heat sink 106 can be connected or mounted to the circuit board 102 in different manners, such as by soldering, brazing, or welding the heat sink 106 to the second side of the circuit board 102. In various embodiments, the heat sink 106 can be oriented perpendicular to the circuit board 102. In various embodiments, the light source 100 is arranged such that the heat sink 106 can be disposed on top of the circuit board 102 with respect to the direction of gravity. In various embodiments, the light source 100 can be arranged such that the heat sink 106 is disposed below the circuit board 102 with respect to the direction of gravity.

In various embodiments, the light source 100 can include electrical connections 108, such as locations to connect the circuit board to wires or a power supply. The electrical connections can be electrically connected to the one or more emitters, such as to provide power to the LEDs.

In some embodiments, the electrical connections 108 can include one or more solder pads, such as two solder pads, that can either accept solder on wires for power or connectors which are configured to receive wires for power. Other power connection geometries and numbers of contacts are possible. Some embodiments herein can include a TVS ESD protection device across the power input wires. Some embodiments herein can include a space for labeling the light source 100 with a serial number, part number, date code and/or configuration information. In some embodiments, a constant current driver can be used to provide power to the circuit.

Various embodiments provided herein include a heat sink 106. In some embodiments, the heat sink 106 can include a flat wire coil, such as shown in FIG. 1. In some embodiments, the heat sink 106 can be sized to maximize contact with a thermal pad disposed on the opposite side of the circuit board 102 from each LED (i.e. the second side mentioned above). In some embodiments, the heat sink 106 can be soldered to the circuit board 102, such as at one or more thermal pads. In some embodiments, the circuit board 102 can include a thermal pad on the opposite side of the circuit board 102 from each LED. In some embodiments, the LEDs can be disposed in a circular array.

In some embodiments, the light source 100 can have a diameter of less than 3 inches, less than 2.9 inches, less than 2.8 inches, or less than 2.75 inches, such as to fit within a housing or a protective enclosure with an internal diameter of about 3 inches. In some embodiments, the light source 100 can fit within a housing or a protective enclosure with an outer diameter of about 3 inches. In some embodiments, the light source 100 can be disposed within a housing or a protective enclosure with a concentric opening permitting the projection of light. In some embodiments, the housing or protective enclosure can be in the form of a tube style housing or protective enclosure.

In some embodiments, the light source 100 can include a second circuit board. It should be understood that the description herein of the circuit board 102 can also apply to the second circuit board. The second circuit board can be bonded, such as thermally bonded, to the heat sink 106 on an opposite side from the circuit board 102. Similar to the circuit board 102, emitters or LEDs can be mounted on the second circuit board on a side opposite from the heat sink 106.

Figure 2:
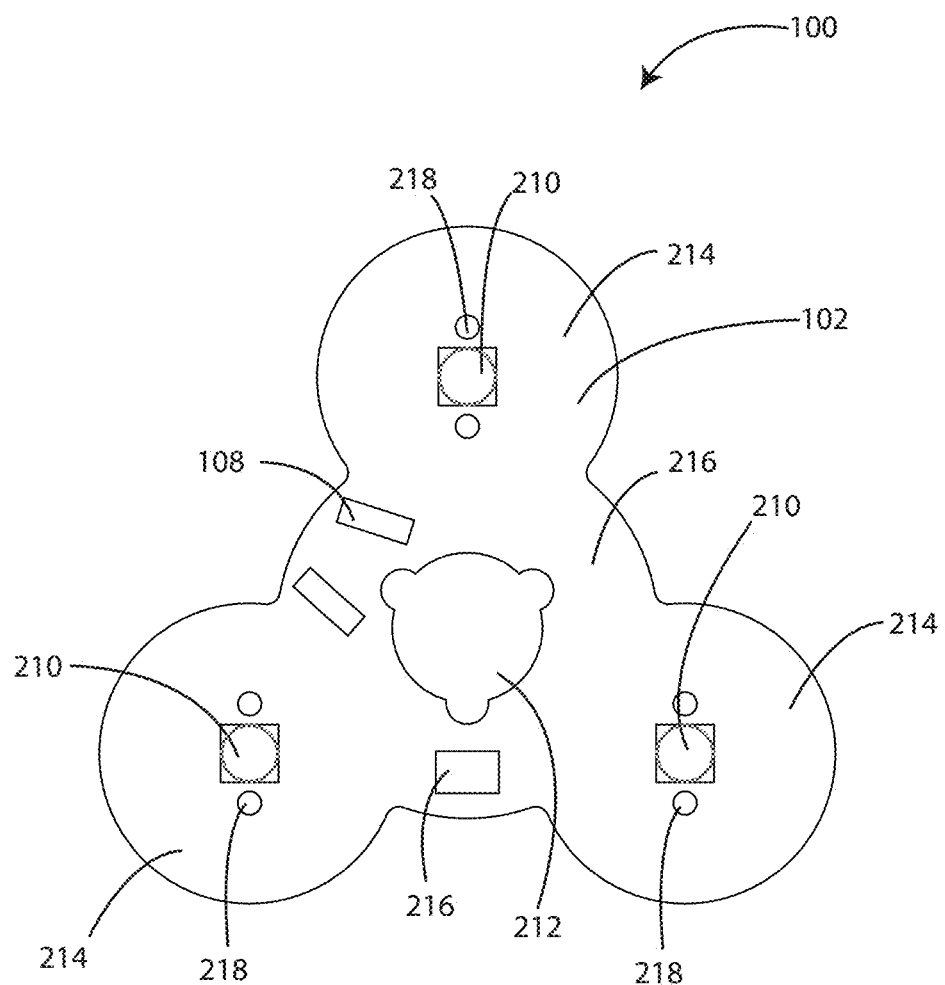
FIG. 2 is a top view of a circuit board in accordance with various embodiments herein.

FIG. 2 shows a top view of a light source 100 including circuit board 102 and three emitters 210 in accordance with various embodiments. In some embodiments, a plurality of emitters are arranged in a polygonal pattern on the circuit board 102. In some embodiments, a plurality of emitters are arranged in a triangle pattern on the circuit board 102. In some embodiments, a plurality of emitters are arranged in an equilateral triangle pattern on the circuit board 102. In the depicted embodiment the emitters 210 are positioned in an equilateral triangular arrangement, so that a heat sink 106 in the form of a circular coil can contact the thermal pads on the back side of the circuit board 102. A variety of arrangements including one or more emitters are also possible so long as the heat sink 106 can contact the thermal pads at the back side of the circuit board 102.

In various embodiments, the circuit board 102 can include one or more circular lobes 214. Including circular lobes 214 can result in higher symmetry and less material being used. In some embodiments, the lobes 214 can be used to attach components, such as an emitter or a lens. Various other embodiments can include other shapes.

The embodiment of FIG. 2 can include a maximum outside tangential diameter of 2.736 inches, such as to allow for a clearance fit inside of a 3 inch tube with .125 inch walls. Some embodiments can include vent spaces or apertures 216 between the lobes 214. The vent spaces or apertures 216 can allow air flow through circuit board 102 and through the heat sink 106. In various embodiments, the one or more vent spaces or apertures 216 pass through the circuit board 102 from the first side to the second side. Various embodiments can include different shapes for the circuit board 102. The embodiment shown in FIG. 2 has been designed to maximize the openness through the circuit board 102 and the heat sink 106 to aid in removing heat from the light source 100.

Various embodiments can include alignment features 218 around or adjacent to the emitters 210. The alignment features 218 can allow for a lens 104 to be mounted to the circuit board 102. In some embodiments, the alignment features 218 can include a hole. In some embodiments, the alignment features 218 can include a post, peg or projection. The embodiment shown in FIG. 2 can be assembled and used with or without the lenses, depending on requirements for beam control.

In some embodiments, the circuit board 102 includes an open center. Various embodiments can define a center hole 212. The center hole 212 can be located in the middle of the circuit board 102. Other locations for a center hole 212 are also possible. The center hole 212 can allow a tube, rod, threaded rod, or other structure to pass through the center of the circuit board 102 for mounting, support, or other purposes. In some embodiments a tube, rod, or threaded rod that passes through the center hole 212 to support the circuit board while housed in a protective structure. Some embodiments do not include a center hole.

The circuit board 102 can further define additional slots or holes at or around the perimeter of the circuit board 102, such as to provide a location for other attachment mechanisms, including screws, or twist to lock geometries, to connect to the circuit board 102. In various embodiments, the circuit board 102 can include a printed circuit board. In various embodiments, the circuit board 102 includes multiple layers. In various embodiments, circuit board 102 can be a multilayer thermally conducting circuit board. In various embodiments, the circuit board 102 can be in the form of a FlexRad® circuit board produced by MetroSpec Technology located in Mendota Heights, MN and described in U.S. Pat. No. 8,525,193 issued on Sep. 3, 2013 and titled "LAYERED STRUCTURE FOR USE WITH HIGH POWER LIGHT EMITTING DIODE SYSTEMS," which is hereby incorporated in reference in its entirety. A layered structure of the circuit board 102 can pass heat from a mounted emitter to the opposite (second) side of the circuit board. In some embodiments, the heat can be passed to a metal layer pad on the opposite side of the circuit board.

In various embodiments, the circuit board 102 can include one or more metal layers. In various embodiments, at least one metal layer is formed of copper or copper coin. In various embodiments, the circuit board 102 can include a metal clad laminate. In various embodiments, the metal layer is thermally bonded to a side of the circuit board 102 and facilitates heat transfer into the heat sink 106.

In various embodiments, the circuit board 102 includes thermal pads, such as one thermal pad for each emitter mounted to the circuit board 102. In various embodiments, the thermal pads are disposed on an opposite side of and are aligned with emitters mounted on the circuit board 102.

In various embodiments, the light source 100 can include a heat sink 106. The heat sink 106 can be mounted to the circuit board 102 to draw heat away from the emitters. Some embodiments herein can include a flat wire that is both highly thermally conductive and solders readily to the circuit board 102. In various embodiments, the light source 100 is arranged so that the heat sink 106 is disposed on an opposite side of the circuit board 102 with respect to the direction of a source of air flow.

In various embodiments, the heat sink 106 can include copper. In various embodiments, the heat sink 106 can include a flat metal wire. In various embodiments, the heat sink 106 can include a flat copper wire. In some embodiments, the heat sink 106 can include at least 99% copper. In some embodiments, the heat sink 106 can include at least 50% copper, at least 60% copper, at least 70% copper, at least 75% copper, at least 80% copper, at least 85% copper, at least 90% copper, or at least 95% copper.

Figure 3:
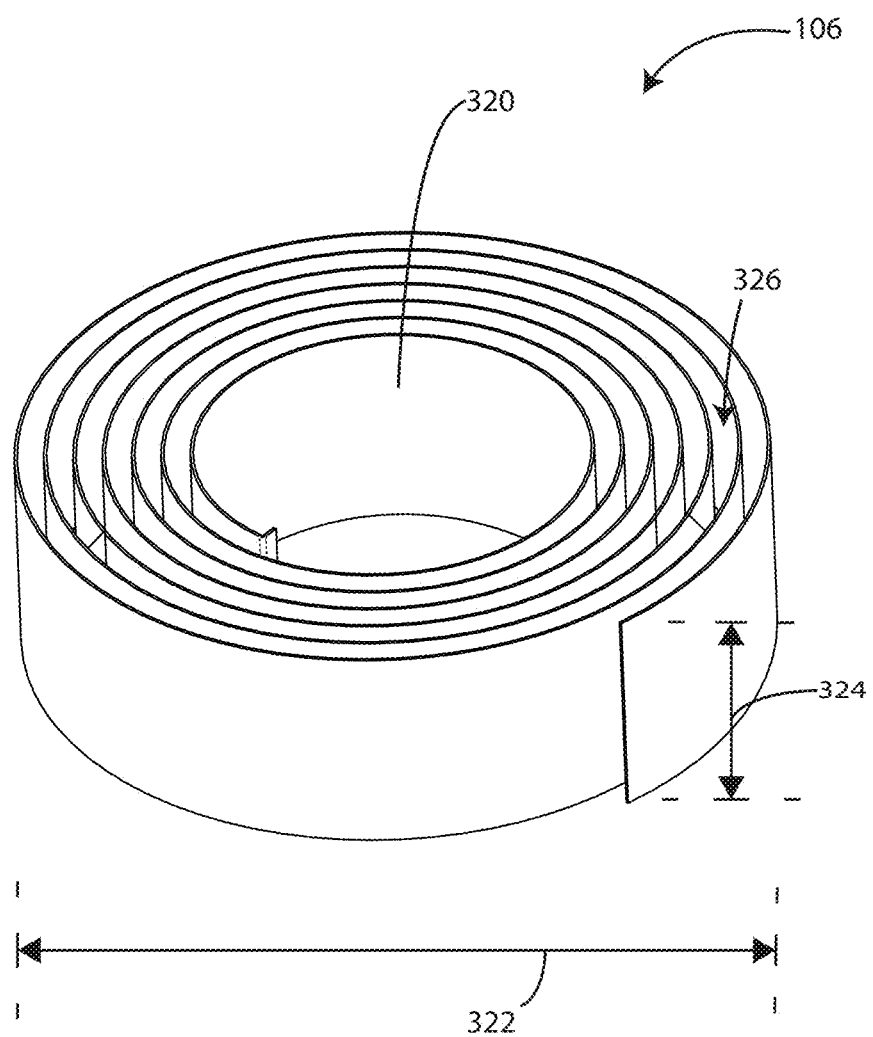
FIG. 3 is a perspective view of a heat sink in accordance with various embodiments herein.

In some embodiments, the heat sink 106 is in the form of a circular coil (FIG. 3). In some embodiments, the heat sink 106 is in the form of a non-circular coil. In some embodiments, the heat sink 106 can be symmetric, such that either side can be attached to the circuit board 102 and the performance of the heat sink 106 will remain the same.

In some embodiments, the heat sink 106 can be black in color. In some embodiments, the heat sink 106 can be white in color.

In various embodiments, flat metal wire is substantially flat. In some embodiments, surfaces of the flat metal wire include surface features that increase surface area. In some embodiments, the surface features can include at least one of perforations, dimples, or ribs.

FIG. 3 shows a perspective view of a heat sink 106 in accordance with various embodiments herein. In some embodiments, the heat sink 106 can be in the form of a coil shaped heat sink.

In various embodiments, the heat sink 106 can include an open center 320. The open center 320 can be aligned with the center hole 212 of the circuit board 102, such as to facilitate a support member to pass through both the circuit board 102 and the heat sink 106.

In some embodiments, the heat sink 106 can be in form of a coil, such as shown in FIG. 3. The heat sink 106 can be designed to contact one or more heat pads on the back side (opposite side from the emitters) of the circuit board 102. In some embodiments, light source 100 is effective to dissipate at least 10 watts of heat from each emitter in steady state. In some embodiments, the heat sink 106 is effective to dissipate at least 30 watts of heat in the aggregate in steady state.

In various embodiments, a material of the heat sink 106, such as the metal wire, wraps around 360 degrees at least 2 and not more than 10 times. In various embodiments, a material of the heat sink 106, such as the metal wire, wraps around 360 degrees at least 2 and not more than 20 times. In various embodiments, a material of the heat sink 106, such as the metal wire, wraps around 360 degrees at least 4 and not more than 8 times. In some embodiments, the heat sink 106 can contact each heat pads at least 2 times, at least 3 times, at least 4 times, at least 5 times, at least 6 times, at least 7 times, at least 8 times, at least 9 times, or at least 10 times.

In various embodiments, the heat sink 106 defines gaps 326 between adjacent wrapped layers of material. In some embodiments, the gaps 326 between adjacent wrapped layers of material are at least 0.01 inches and not more than 0.5 inches. In some embodiments, the gaps 326 between adjacent wrapped layers of material are at least 0.01 inches and not more than 0.1 inches. In some embodiments, the gaps 326 can be at least 0.05 inches and less than 0.1 inch. In some embodiments, the gaps 326 between adjacent wrapped layers of material are at least 0.04 inches and not more than 0.08 inches. In some embodiments, the gaps 326 can be about 0.080 inches between adjacent portions of the coil. Some embodiments herein can include a vertical orientation of the gaps 326 between coils to minimize the resistance to rising air with or without forced air assistance.

In various embodiments, the flat metal wire has a thickness of at least 0.01 inches and not more than 0.05 inches. In various embodiments, the flat metal wire has a thickness of about 0.020 inches. In various embodiments, the flat wire is 10 mil or thinner.

In various embodiments, the heat sink 106 has a height 324 of at least 0.1 inches and not more than 2 inches. In various embodiments, the heat sink 106 has a height 324 of at least 0.5 inches and not more than 1 inch.

In various embodiments, the heat sink 106 has a diameter 322 of at least 0.5 inches and not more than 10 inches. In various embodiments, the heat sink 106 has a diameter 322 of at least 1.5 inches and not more than 5 inches. In some embodiments, the inside open dimension of the open center 320 of the heat sink 106 can be about 1.25 inches. In some embodiments, the outside diameter 322 of the heat sink 106 can be about 2.125 inches.

Figure 4:
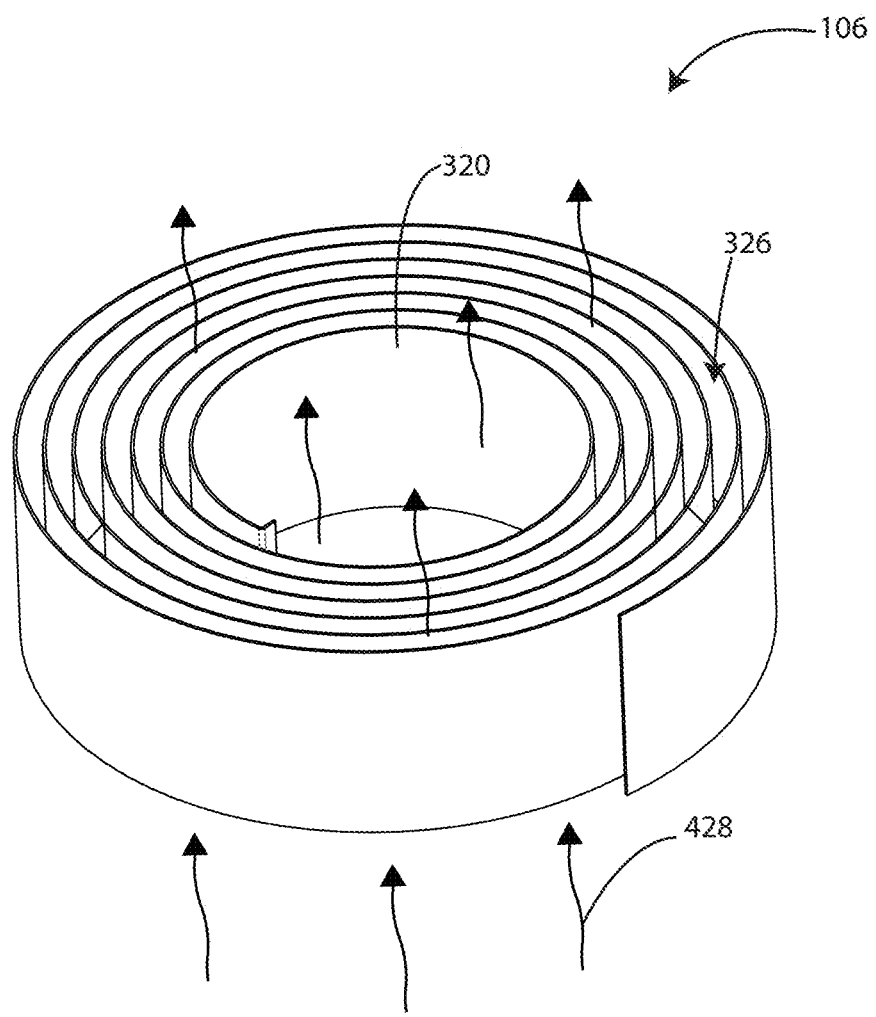
FIG. 4 is a perspective view of a heat sink in accordance with various embodiments herein.

FIG. 4 is a perspective view of a heat sink 106 in accordance with various embodiments herein. Air can flow through the heat sink 106, such as depicted by the arrows 428. The air can flow through gaps 326. The air can flow through the open center 320 when the open center 320 is not occupied by a support member.

In some embodiments, the light source 100 can include an element to force air through the heat sink 106, such as a fan or blower. In some embodiments, gravity moves air through the heat sink 106.

Various embodiments can include the channeling of air through slots or vents in the circuit board 102. The channeling of air through the slots or vents in the circuit board 102 can enable air contact and flow across each coil of the heat sink 106 from at least two sides.

Figure 5:
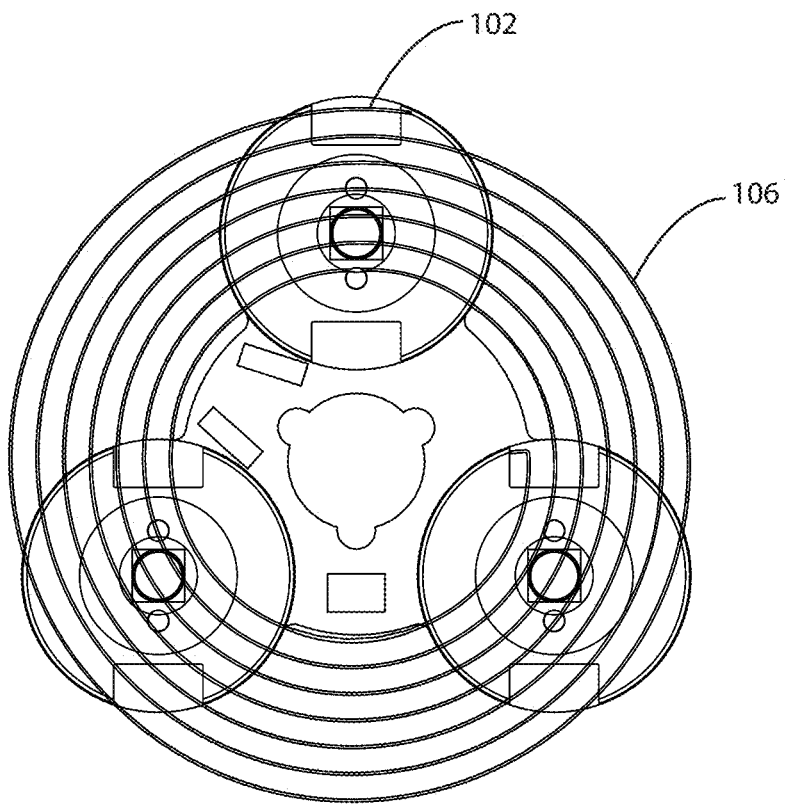
FIG. 5 is a bottom view of a heat sink and circuit board in accordance with various embodiments herein.

FIG. 5 is a bottom view of a heat sink and circuit board in accordance with various embodiments herein. In some embodiments, the outside width (diameter 322) of the heat sink 106 can be less than the diameter of the circuit board 102, such as shown in FIG. 5. In some embodiments, a portion of the heat sink 106 is not overlapped by the circuit board 102. The heat sink 106 being smaller than the diameter of the circuit board 102 can benefit air flow through the heat sink. The heat sink 106 being smaller than the diameter of the circuit board 102 can provide clearance from a housing or cylinder that the light source 100 is, at least partially, disposed within.

Figure 6:
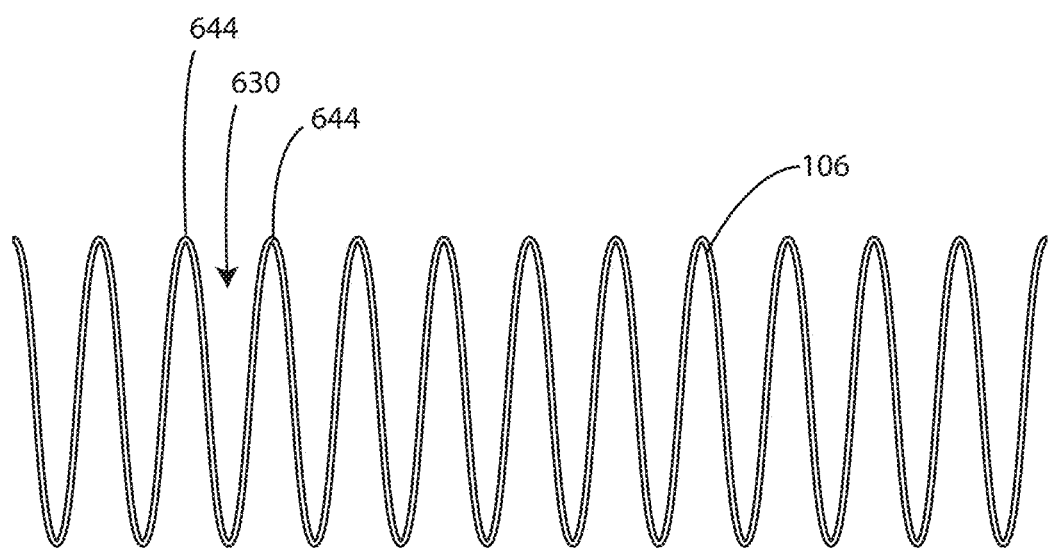
FIG. 6 is a top view of a heat sink in accordance with various embodiments herein.
Figure 7:
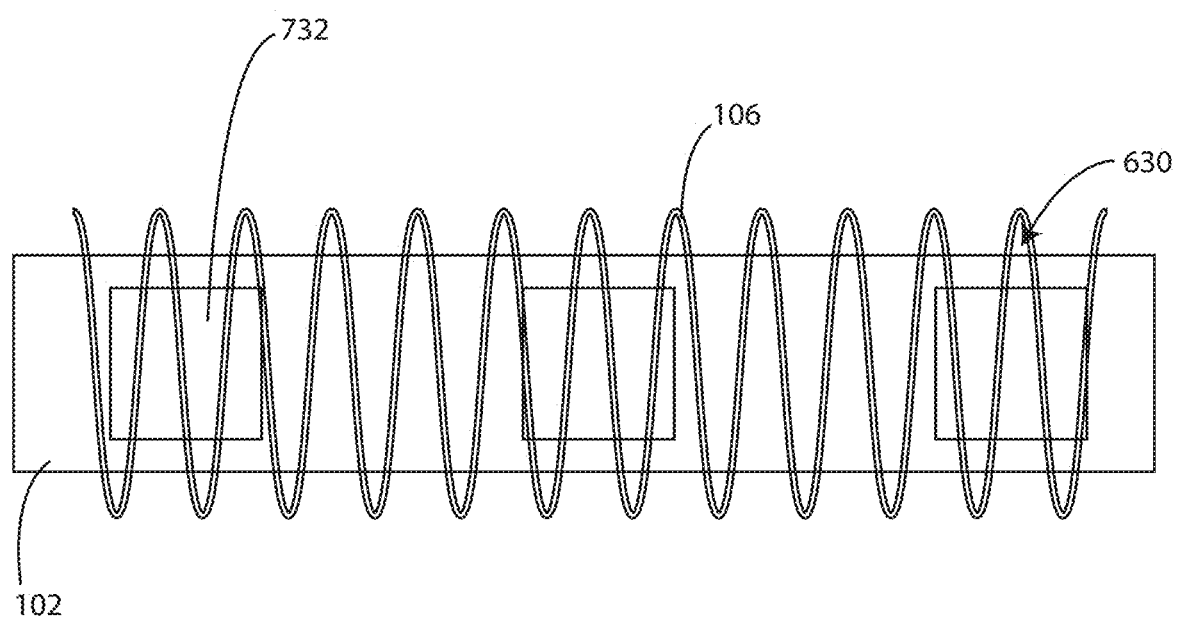
FIG. 7 is a bottom view of a heat sink and circuit board in accordance with various embodiments herein.

In some embodiments, the heat sink 106 can include a flat strip of wire that is bent or formed into a serpentine configuration or an accordion configuration, such as shown in FIGS. 6 and 7. FIG. 6 is a top view of a heat sink 106 in accordance with various embodiments herein. FIG. 7 is a bottom view of a heat sink and circuit board in accordance with various embodiments herein. The heat sink 106 can include a plurality of switchbacks 644. In various embodiments, the serpentine shaped heat sink 106 defines channels 630 between adjacent switchbacks 644.

In various embodiments, a longitudinal axis of the circuit board 102 is parallel with a longitudinal axis of the serpentine shaped heat sink 106. In various embodiments, the serpentine shaped heat sink 106 is soldered, brazed, or welded to the second side of the circuit board 102.

A serpentine configuration of the heat sink 106 can be implemented in embodiments with one or more emitters mounted to a circuit board 102 linearly or in a patterned rectangle. In various embodiments, a plurality of emitters can be arranged in a line on the circuit board 102. In some embodiments, the circuit board 102 can be rectangular. In some embodiments, the bent ends (ends of the switchbacks 644) of the heat sink 106 can extend beyond the perimeter of the circuit board 102 to allow channels 630 to have adequate air flow, such as shown in FIG. 7. In various embodiments, a portion of the serpentine shaped heat sink 106 is not overlapped by the circuit board 102. In various embodiments, an outside width of the serpentine shaped heat sink 106 is greater than an outside width of the circuit board 102. FIG. 7 also shows thermal pads 732 on the second side of the circuit board 102 and connected to the heat sink 106.

The one or more emitters can be mounted on a first side of the circuit board 102. In some embodiments, the emitter can include a LED. In some embodiments, the LED can be COB, SMD, or DIP LEDs. In some embodiments, an emitter or LED can be in the form of a Nichia NV4x144 series LED component, which can operate at up to 16 watts each with adequate cooling. In some embodiments, an emitter or LED can be in the form of a Nichia NV4L144A LED, which can have a small size, high power, and a low beam spread. Other types and manufacturers LED and LED arrays (including chip on board devices) can be incorporated into various embodiments. In some embodiments, the emitter can have a domed encapsulating optic, such as with a beam spread of about 90 degrees.

In various embodiments, the at least one emitter is at least 1 W. In various embodiments, the at least one emitter is at least 5 W. In various embodiments, the at least one emitter is at least 10 W. In various embodiments, the at least one emitter is at least 15 W.

In various embodiments, at least one of a lens 104 and a reflector is coupled to the circuit board 102. The lens 104 can be configured to direct the light from an emitter 210 in a desired direction. Various embodiments can include a lens 104 disposed on each emitter 210. In some embodiments, a lens 104 can be a Khatod lens. In some embodiments, the lenses 104 can be in form of the Khatod Silver series.

Figure 8:
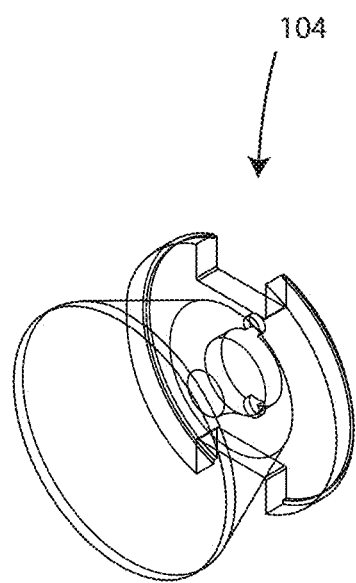
FIG. 8 is a perspective view of a lens in accordance with various embodiments herein.
Figure 9:
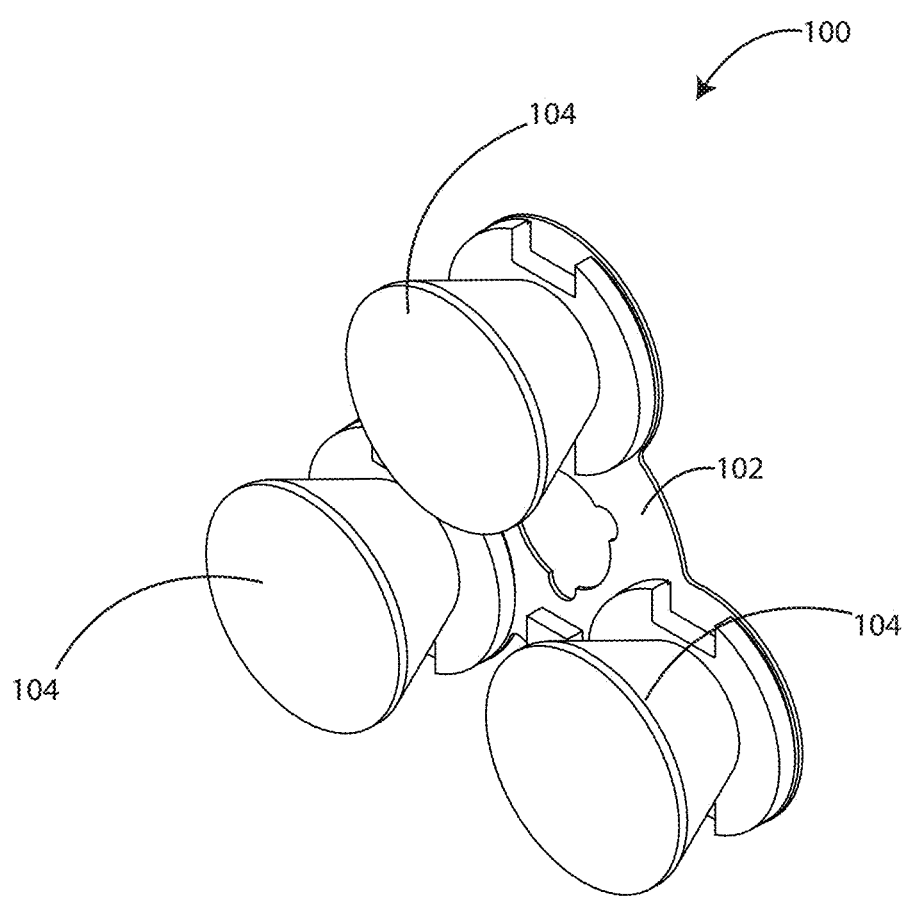
FIG. 9 is a perspective view of a circuit board and lenses in accordance with various embodiments herein.

FIG. 8 shows a perspective view of a lens 104 in accordance with various embodiments herein. FIG. 9 shows a perspective view of a circuit board 102 and lenses 104 in accordance with various embodiments herein. In the embodiment shown in FIG. 9, there are three emitters 210 mounted on the circuit board 102, and three lenses 104 mounted to the circuit board 102. Each lens 104 can correspond to one of the three emitters 210.

Figure 10:
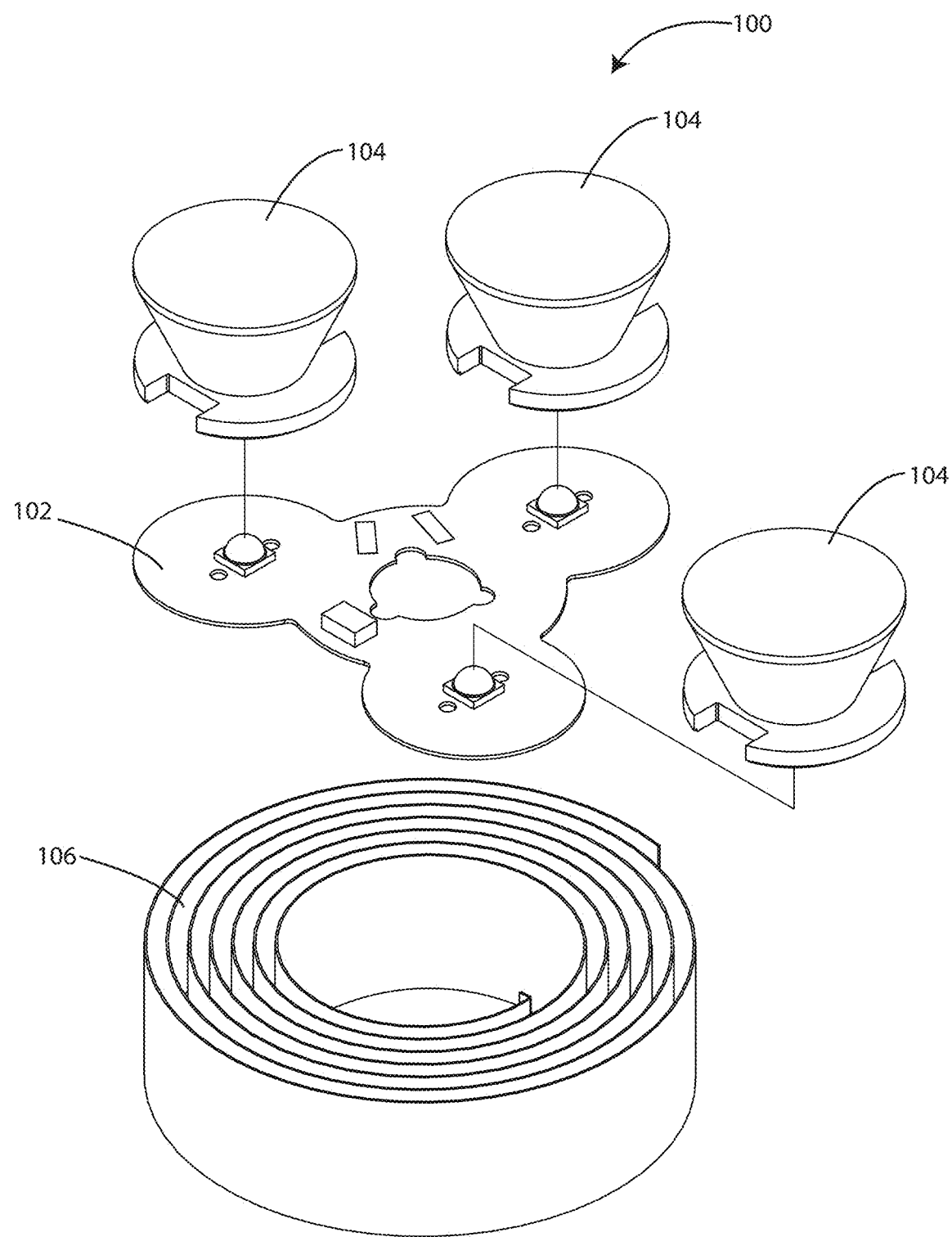
FIG. 10 is an exploded view of a circuit board, lenses, and a heat sink in accordance with various embodiments herein.

FIG. 10 shows an exploded view of a circuit board 102, lenses 104, and a heat sink 106 in accordance with various embodiments herein. Similar to FIG. 9, the circuit board 102 includes three emitters 210.

Figure 11:
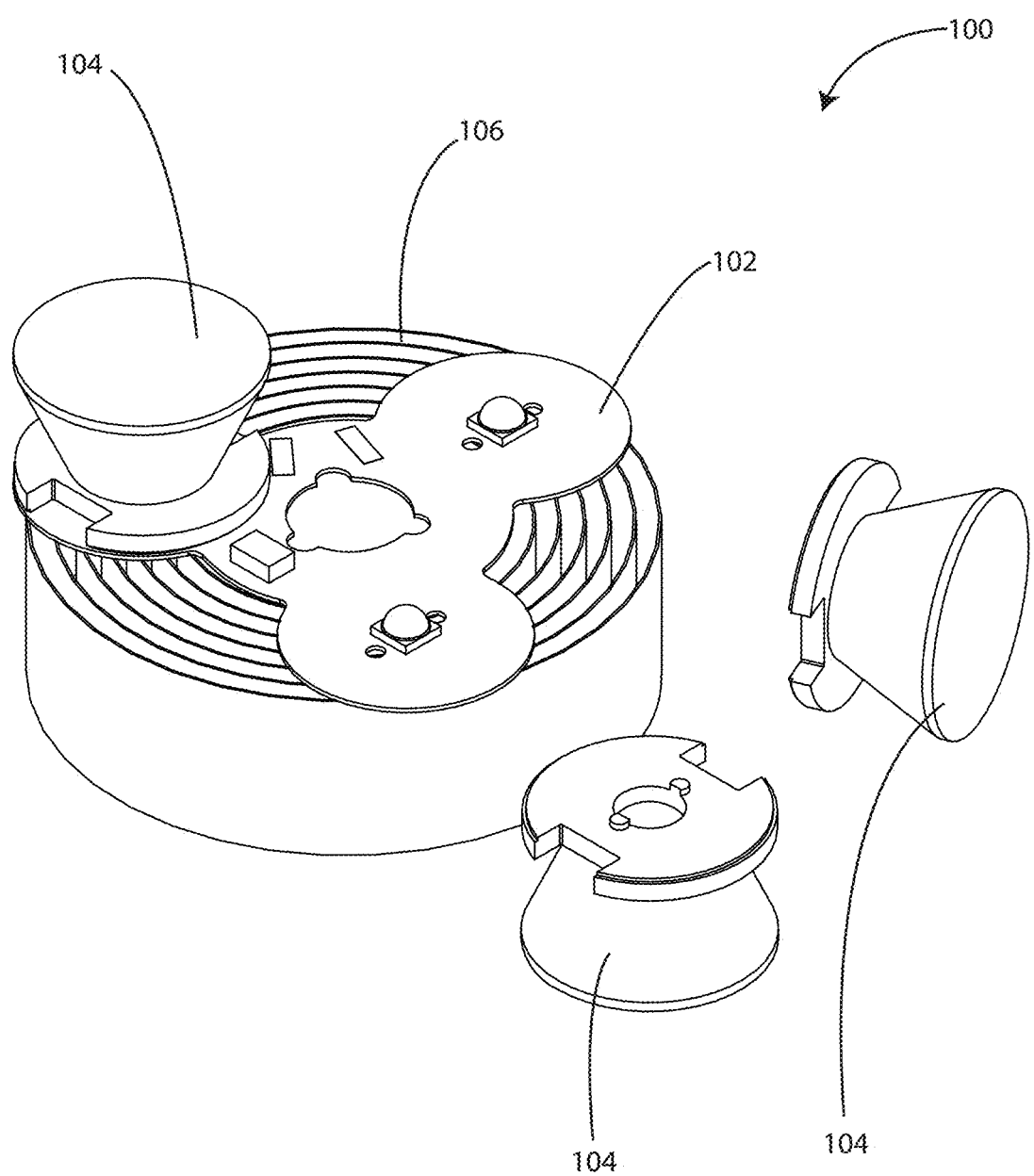
FIG. 11 is a partially exploded view of a circuit board, lenses, and a heat sink in accordance with various embodiments herein.

FIG. 11 shows a partially exploded view of a circuit board 102, lenses 104, and a heat sink 106 in accordance with various embodiments herein. A lens 104 can be attached or coupled to the circuit board 102 such as with an adhesive. The lens 104 can be attached to the emitter (LED) side of the circuit board 102. In some embodiments, the lens 104 can include a peel and stick adhesive.

In some embodiments, the lenses 104 can be aligned to the emitters with a small projection or post that inserts into the circuit board 102, such as to mate with an alignment feature 218 shown in FIG. 2.

Figure 12:
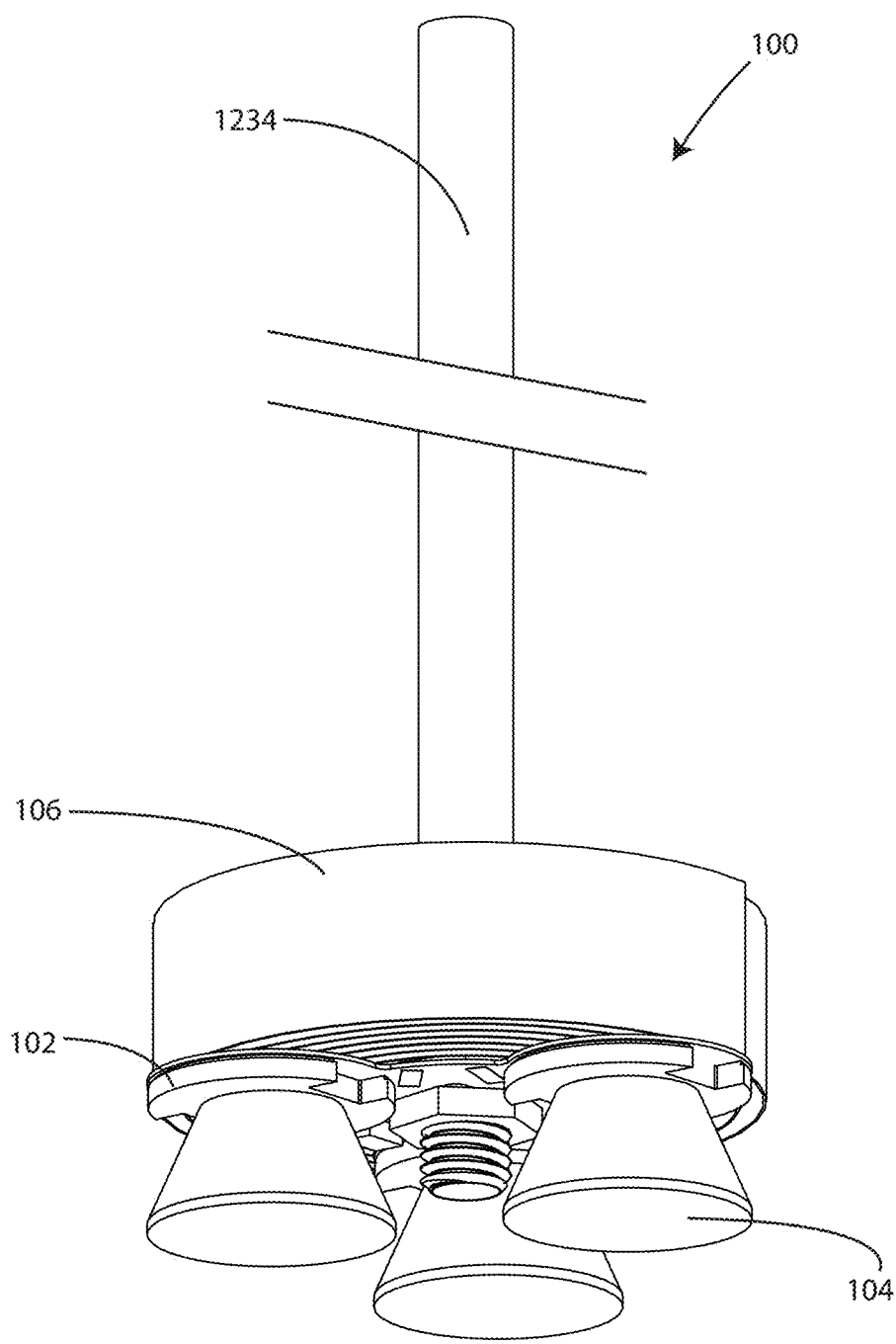
FIG. 12 is a perspective view of a light source in accordance with various embodiments herein.
Figure 13:
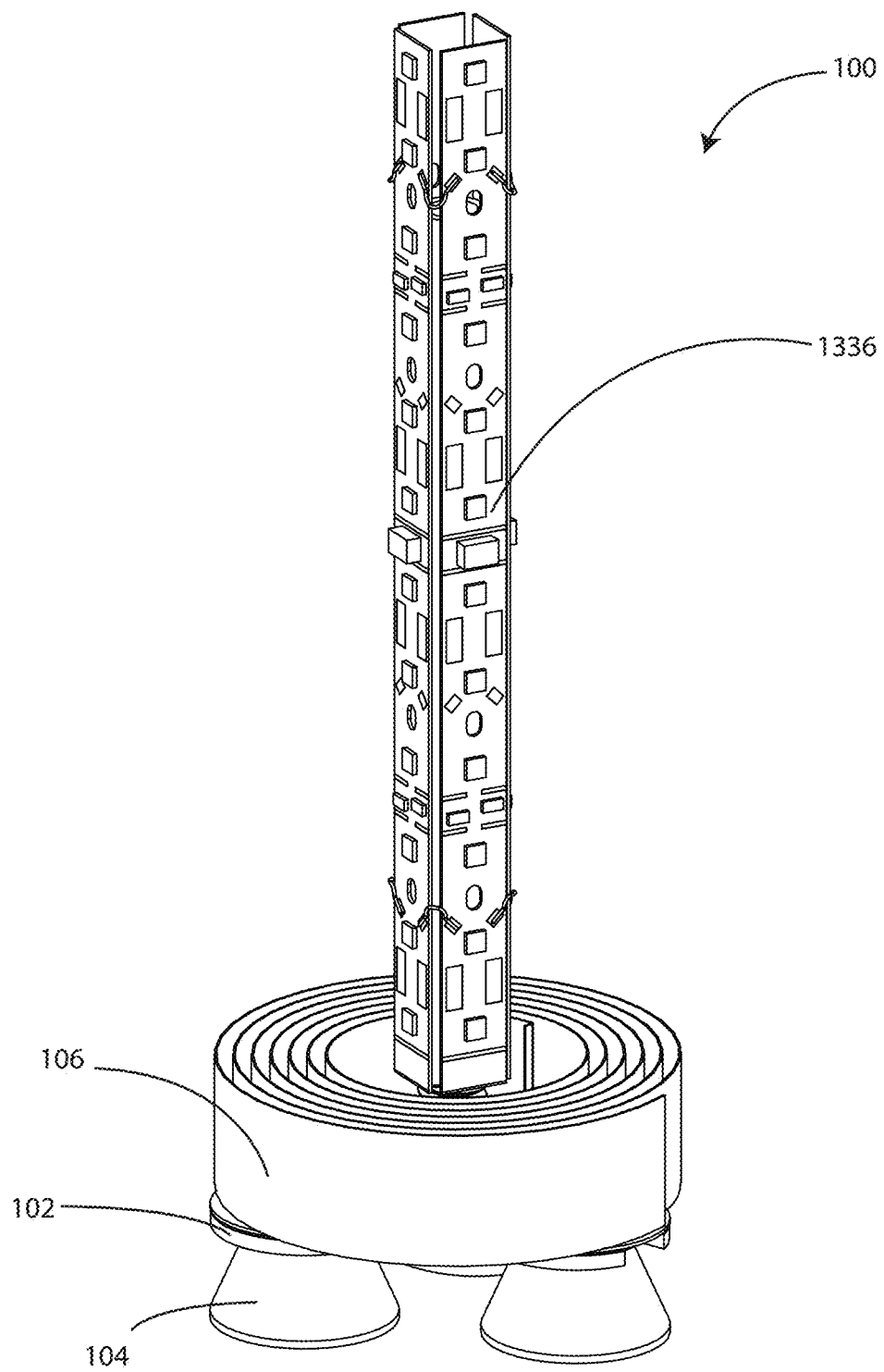
FIG. 13 is a perspective view of a light source in accordance with various embodiments herein.
Figure 14:
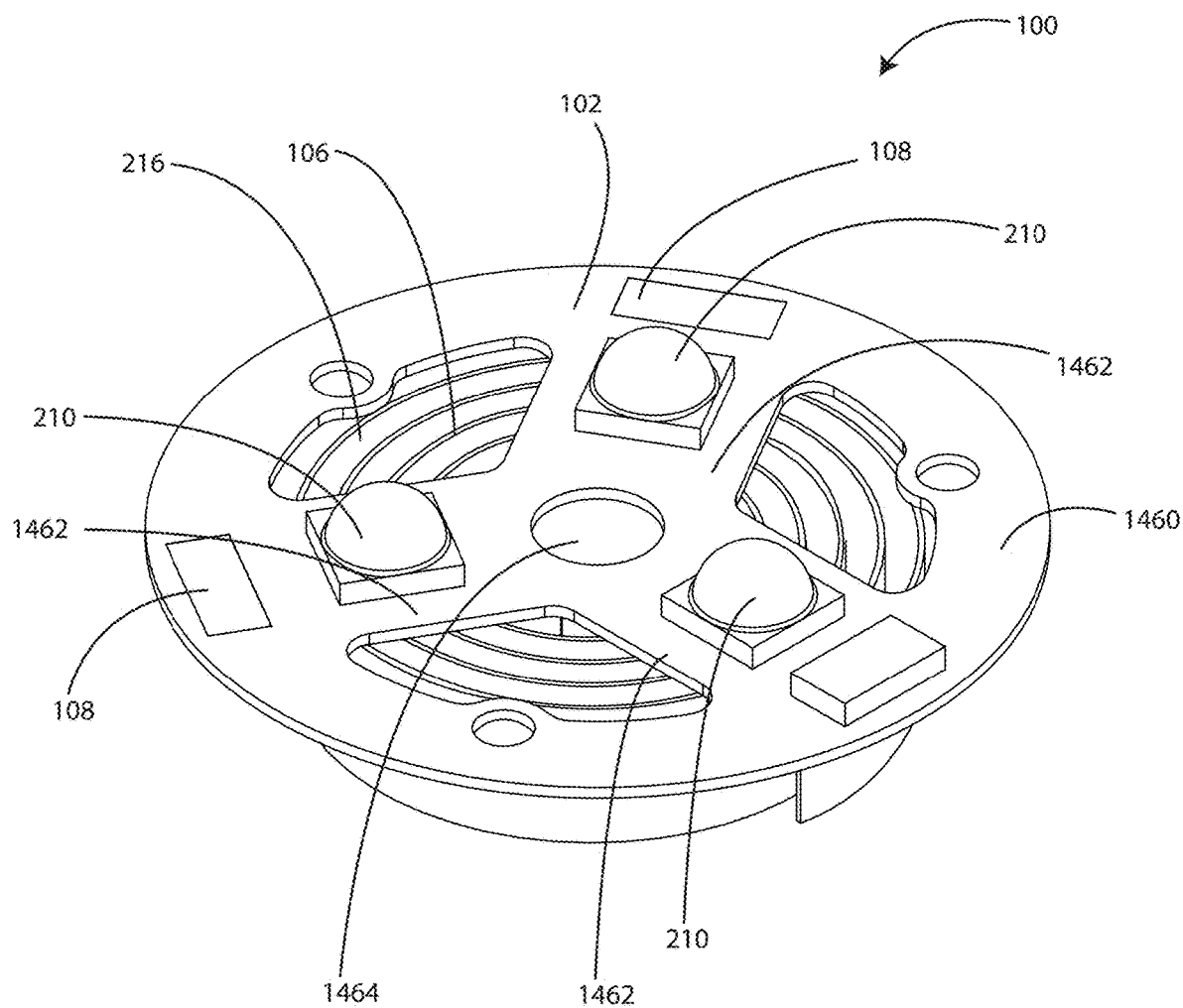
FIG. 14 is a perspective view of a light source in accordance with various embodiments herein.

FIGS. 12-14 show various light sources. FIG. 12 shows a perspective view of a light source 100 in accordance with various embodiments herein. The light source 100 shown in FIG. 12 includes a circuit board 102, three lenses 104, a heat sink 106. The light source 100 further includes a rod 1234 that passes through the open center 320 of the heat sink 106 and the center hole 212 of the circuit board 102. The rod 1234 can be configured to support the heat sink 106, the circuit board 102, the emitters 210, and the lenses 104, such as to hold them in a desired location.

FIG. 13 shows a perspective view of a light source 100 in accordance with various embodiments herein. The light source 100 shown in FIG. 13 includes a circuit board 102, three lenses 104, a heat sink 106. The light source 100 further includes additional circuit board 1336. The additional circuit boards 1336 can include emitters and form a circuit with the circuit board 102. The additional circuit boards 1336 can be of the type disclosed in U.S. Pat. No. 8,525,193, which has been incorporated by reference in its entirety. The additional circuit boards 1336 can be free standing, such that the additional circuit boards 1336 support the assembly of the heat sink 106, the circuit board 102, and the lenses 104, similar to the rod 1234 in FIG. 12. In other embodiments, the additional circuit boards 1336 can be coupled to a rod, such as rod 1234 shown in FIG. 12. In some embodiments, the additional circuit boards 1336 can surround the rod 1234, such that the rod 1234 is not visible.

FIG. 14 is a perspective view of a light source 100 in accordance with various embodiments herein. The light source 100 can include a plurality of emitters 210 mounted on the first side of the circuit board 102. The light source 100 can include a heat sink 106 mounted on the second side of the circuit board 102. The light source 100 shown in FIG. 14 further includes vents or apertures 216 to allow airflow through the circuit board 102 and through the heat sink 106. In some embodiments, the light source 100 can be disposed within a housing. In some embodiments, the housing can be a cylinder.

In various embodiments, the circuit board 102 can include an outer ring 1460. In some embodiments, the outer ring 1460 is circular. In some embodiments, the circuit board 102 can include a plurality of extension 1462. Each extension 1462 can project from the outer ring 1460 towards a center of the circuit board 102. In various embodiments, the plurality of extensions 1462 are equally distributed around a center axis of the outer ring 1460. In various embodiments, the circuit board 102 defines at least one vent 216. In various embodiments, the circuit board 102 defines a plurality of vents 216. In various embodiments, the plurality of vents 216 are equally distributed around a center axis of the outer ring 1460. In various embodiments, the circuit board 102 includes a center opening 1464. In some embodiments, an outside width of the heat sink 106 is less than an outside width of the circuit board 102.

In various embodiments, the circuit board 102 can include a plurality of emitters. In some embodiments, each of the emitters is disposed on an extension 1462. In some embodiments, each extension has at least one emitter disposed on it. In some embodiments, each extension has exactly one emitter disposed on it. In some embodiments, the plurality of emitters can be arranged in a circular pattern, such as circular pattern around a center axis of the circuit board 102.

Figure 15:
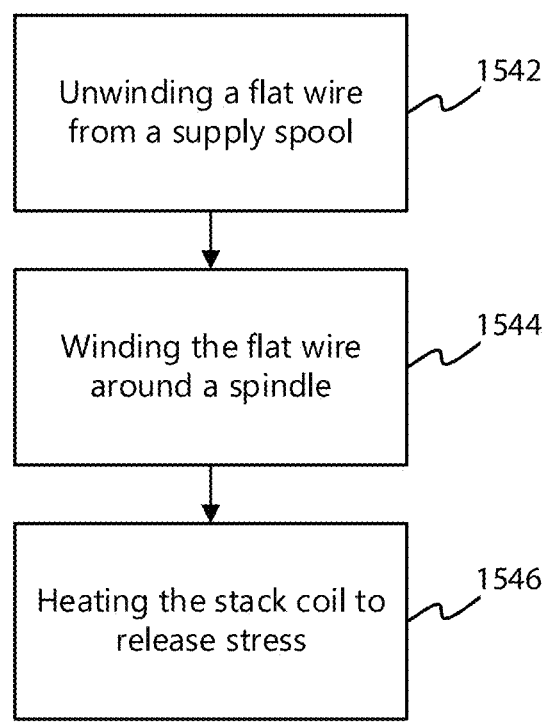
FIG. 15 is a flowchart depicting a method in accordance with various embodiments herein.

FIG. 15 is a flowchart depicting a method in accordance with various embodiments herein. The method can be a method for making heat sinks on a spindle, such as the coiled heat sinks disclosed herein.

The method can include unwinding a flat wire from a supply spool 1542. The method can include winding the flat wire around the spindle with spacing between adjacent wraps of the flat wire to form a stacked coil 1544. In various embodiments, winding the flat wire can include winding a plurality of flat wires simultaneously. In some embodiments, winding the flat wire can include winding a plurality of flat wires simultaneously side by side. In some embodiments, winding the flat wire can include winding at least 10 flat wires simultaneously side by side. The method can include heating the stacked coil to release stress therein 1546. Other embodiments do not include heating the stacked coil. Some embodiments may include previous treatment of the metal. Some previous treatments of the metal make heating the stacked coil unnecessary. In other embodiments, the type of metal used for the heat sink can make heating the stacked coil unnecessary. In some embodiments, the geometry of the wire or the geometry of the winding can make heating the stacked coil unnecessary. In some embodiments, the method can further include gripping a terminal end of the stacked coil and vibrating it.

In some embodiments, the method can further include winding multiple flat wires around the spindle simultaneously to form multiple stacked coils. In various embodiments, the multiple stacked coils have identical spacing between adjacent wraps of the flat wire. In various embodiments, the spindle can include a slotted spindle.

Various embodiments can provide a method of coil formation that allows multiple coils to be formed on a single spindle, with identical gap spacing, and then separated for individual use. This method can include the stacking of two or more flat wire strips as they are unwound from their spools. Some embodiments include the stacked winding of the stacked wires around a spindle. As an example, in an implementation of this method, a spindle with a diameter of 1.25 inches can be used. Various embodiments can include cutting each wire at a desired location for a chosen number of coil wraps, such as 5 to 7 coil wraps in some embodiments. As mentioned above, the method can include the heating of the stacked coil on spindle assembly to release stress on the wire so that it will not seek to uncoil. The method can also include gripping the cut end of the outer coil layer and vibrating it to cause the inner coils to fall out.

Figure 16:
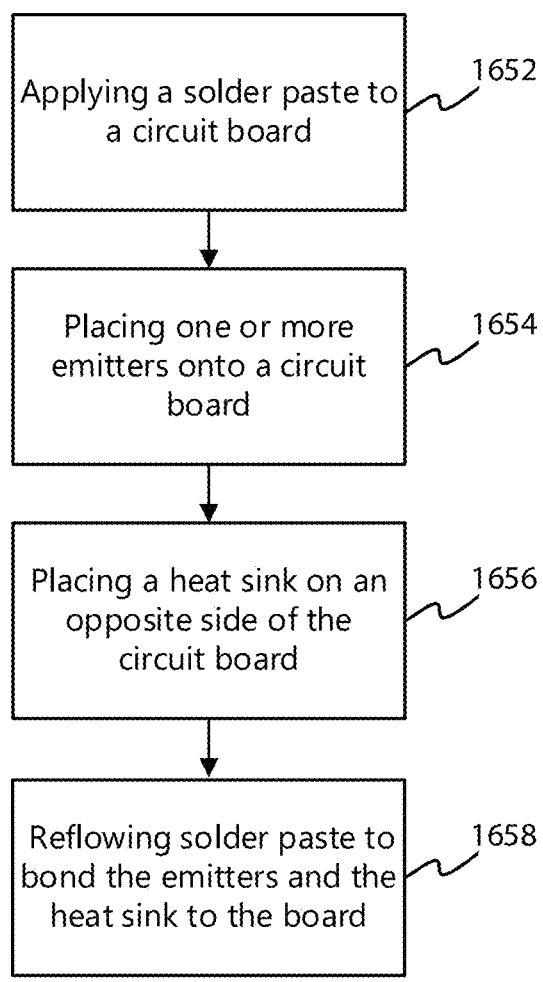
FIG. 16 is a flowchart depicting a method in accordance with various embodiments herein.

FIG. 16 shows a flowchart depicting a method of making a light source in accordance with various embodiments herein. The method can include applying a solder paste to a circuit board 1652. The method can include placing one or more emitters onto a first side of the circuit board 1654. The method can include placing a heat sink onto a second side of the circuit board 1656. The method can include reflowing the solder paste to bond the one or more emitters and the heat sink to the circuit board 1658. In some embodiments, the method can further include attaching one or more lenses to the light source.

In some embodiments, the circuit board can be part of a panel or a strip of circuit boards. In some embodiments, the method can further include separating the circuit board with the bonded one or more emitters and the heat sink from the panel or strip of circuit boards.

In some embodiments, the heat sink 106 can include a coil, such as shown in FIG. 3. In some embodiments, the heat sink 106 can be soldered onto thermal pads on the circuit board 102 opposite the emitters. In preparation for the heat sink 106 to be soldered to the thermal pads, the pads can be coated in a layer of solder paste and the circuit board (with its components) can be centered on top of the heat sink 106.

In various embodiments, a conventional solder reflow oven can be used to melt the solder thereby forming a bond between the heat sink 106 and the circuit board 102.

In some embodiments, a heat profile can be programmed into the oven to allow enough soak time at the highest temperature to safely melt the solder for a complete joint at each coil of the heat sink 106. The coils can expand and/or contract during this process. In some embodiments, the thermal pads can be oversized to allow moth resulting from the expansion and/or contraction. The movement can stop once the solder hardens during cooling and the bond can be complete. This solder bond can follow the contour of the coil edge across the pad. The solder can be chosen to make this bond as it can enable heat transfer.

Various embodiments can include the ability to solder the heat sink to a printed circuit board without risk of damaging the electronic components. Further, the soldering process can be accomplished in one step, including all electronic and heat sink components.

Application of solder paste to the circuit board (or panel of circuit boards) can be done manually or with a conventional solder stencil. In some embodiments, the stencil can deposit a 0.007-inch-thick layer of solder paste to the component electrical pads and to the thermal pads.

Emitters can then be placed on the solder pads. A variety of other components can also be placed on the circuit board, such as electrical protection devices, connectors, components comprising a current regulator from constant voltage input, etc.

The circuit board with electrical components already adhered with solder paste can be aligned and placed in contact with the flat edge of the heat sink. The method can include placing the circuit board on top of the heat sink, although in some embodiments the circuit board may have been placed on heat sink.

In a single pass through a reflow oven, the solder can be melted and the board, its components, and the heat sink can be permanently bonded. A special heat profile can be used that preheats, peaks the temperature to melt the solder, and then cools the assembly. Other methods of heating the solder paste are possible, including hot air, mechanical contact with a heated surface, laser heating, or infrared heading.

After cooling from the oven, the light source assemblies may be cut from a carrier panel, if the circuit boards were panelized. After cooling, lenses may be fastened to the assembly. In various embodiments, the lenses can be attached with a pressure sensitive adhesive.

It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

As used herein, the recitation of numerical ranges by endpoints shall include all numbers subsumed within that range (e.g., 2 to 8 includes 2.1, 2.8, 5.3, 7, etc.).

The headings used herein are provided for consistency with suggestions under 37 CFR 1.77 or otherwise to provide organizational cues. These headings shall not be viewed to limit or characterize the invention(s) set out in any claims that may issue from this disclosure. As an example, although the headings refer to a "Field," such claims should not be limited by the language chosen under this heading to describe the so-called technical field. Further, a description of a technology in the "Background" is not an admission that technology is prior art to any invention(s) in this disclosure. Neither is the "Summary" to be considered as a characterization of the invention(s) set forth in issued claims.

The embodiments described herein are not intended to be exhaustive or to limit the invention to the precise forms disclosed in the following detailed description. Rather, the embodiments are chosen and described so that others skilled in the art can appreciate and understand the principles and practices. As such, aspects have been described with reference to various specific and preferred embodiments and techniques. However, it should be understood that many variations and modifications may be made while remaining within the spirit and scope herein.

The invention claimed is:

1. A high-output LED light source comprising:
at least one LED;
a circuit board, wherein the at least one LED is mounted on a first side of the circuit board; and
a spiral planar heat sink, wherein the spiral planar heat sink comprises a continuous spiral coil forming a plurality of windings, the windings continuously extending radially outward from a center axis, such that successive windings fall within a common plane, wherein the spiral planar heat sink is thermally bonded to a second side of the circuit board.

2. The high-output LED light source of claim 1, wherein the spiral planar heat sink is soldered, brazed, or welded to a second side of the circuit board.

3. The high-output LED light source of claim 1, the circuit board comprising an open center.

4. The high-output LED light source of claim 1, wherein the spiral planar heat sink comprises a spiral metal flat wire, wherein surfaces of the spiral metal flat wire are substantially flat.

5. The high-output LED light source of claim 1, wherein the spiral planar heat sink comprises a spiral metal flat wire, wherein surfaces of the spiral metal flat wire include surface features to increase surface area.

6. The high-output LED light source of claim 1, the spiral planar heat sink comprising an open center.

7. The high-output LED light source of claim 1, wherein a portion of the spiral planar heat sink is not overlapped by the circuit board.

8. The high-output LED light source of claim 1, further comprising a plurality of LEDs, wherein the plurality of LEDs are mounted on the first side of the circuit board.

9. The high-output LED light source of claim 1, wherein a material of the spiral planar heat sink wraps around 360 degrees from 2 to 10 times.

10. The high-output LED light source of claim 1, the spiral planar heat sink comprising gaps between adjacent wrapped layers of material.

11. A high-output LED light source comprising:
at least one LED; and
a circuit board, the circuit board comprising
an outer ring; and
a plurality of extensions, wherein the plurality of extensions each projects from the outer ring towards a center of the circuit board,
wherein a plurality of vents are defined by the circuit board; and
a flat wire strip spiral heat sink, wherein the flat wire strip spiral heat sink comprises a flat wire strip forming a plurality of windings, the windings continuously extending radially outward from a center axis, such that successive windings are disposed at different distances from the center axis, wherein the flat wire strip spiral heat sink is thermally bonded to a second side of the circuit board;
wherein the at least one LED is coupled to a first side of the circuit board.

12. The high-output LED light source of claim 11, wherein the flat wire strip spiral heat sink is soldered, brazed, or welded to the second side of the circuit board.

13. The high-output LED light source of claim 11, further comprising a plurality of LEDs, wherein each of the plurality of LEDs is disposed on an extension.

14. The high-output LED light source of claim 11, wherein the plurality of extensions are equally distributed around a center axis of the outer ring.

15. The high-output LED light source of claim 11, wherein the plurality of vents are equally distributed around a center axis of the outer ring.

16. A high-output LED light source comprising:
at least one LED;
a circuit board, wherein the at least one LED is mounted on a first side of the circuit board;
a flat wire spiral heat sink, wherein the flat wire forms a plurality of windings that continuously extend around a center axis at varying distance from the center axis; and
a rod;
wherein the flat wire spiral heat sink is soldered to a second side of the circuit board;
wherein the rod is coupled to the circuit board.

17. The high-output LED light source of claim 16, the circuit board comprising an open center, wherein the rod is partially disposed in the open center.

18. The high-output LED light source of claim 16, wherein a portion of the flat wire heat sink is not overlapped by the circuit board.

19. The high-output LED light source of claim 16, the circuit board comprising one or more vent spaces, wherein the one or more vent spaces pass through the circuit board from the first side to the second side.

20. The high-output LED light source of claim 19, further comprising a second circuit board comprising a plurality of LEDs and a third circuit board comprising a plurality of LEDs, wherein the second and third circuit boards are coupled to the rod.

* * * * *